(12) United States Patent
Kim et al.

(10) Patent No.: US 11,271,179 B2
(45) Date of Patent: Mar. 8, 2022

(54) STRETCHABLE DISPLAY DEVICE

(71) Applicant: LG Display Co., Ltd., Seoul (KR)

(72) Inventors: Kihan Kim, Paju-si (KR); Hyokang Lee, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 165 days.

(21) Appl. No.: 16/516,516

(22) Filed: Jul. 19, 2019

(65) Prior Publication Data

US 2020/0028102 A1   Jan. 23, 2020

(30) Foreign Application Priority Data

Jul. 20, 2018   (KR) .......................... 10-2018-0084928

(51) Int. Cl.
| | |
|---|---|
| *H01L 51/00* | (2006.01) |
| *H01L 51/52* | (2006.01) |
| *H01L 27/32* | (2006.01) |
| *G09F 9/30* | (2006.01) |

(52) U.S. Cl.
CPC .......... *H01L 51/0097* (2013.01); *G09F 9/301* (2013.01); *H01L 27/3244* (2013.01); *H01L 51/5206* (2013.01); *H01L 51/5221* (2013.01); *H01L 51/5237* (2013.01); *H01L 2227/32* (2013.01); *H01L 2251/5338* (2013.01)

(58) Field of Classification Search
CPC . H05K 1/02; H05K 1/18; H01L 27/15; H01L 27/32; H01L 51/00; H01L 51/52; G06F 1/16
USPC ......................... 361/748–750, 794–767, 803; 174/254–258; 349/149–151
See application file for complete search history.

(56) References Cited

U.S. PATENT DOCUMENTS

| | | | |
|---|---|---|---|
| 9,040,337 B2 | 5/2015 | Park et al. | |
| 9,536,860 B2 | 1/2017 | Toon et al. | |
| 9,844,133 B2* | 12/2017 | Tomita | H05K 1/18 |
| 10,334,724 B2* | 6/2019 | Hsu | H01L 23/5387 |
| 10,959,326 B2* | 3/2021 | Okimoto | H01B 7/06 |
| 2002/0094701 A1 | 7/2002 | Biegelsen et al. | |
| 2004/0192082 A1 | 9/2004 | Wagner et al. | |

(Continued)

FOREIGN PATENT DOCUMENTS

| | | |
|---|---|---|
| CN | 108183126 A | 6/2018 |
| EP | 3104370 A1 | 12/2016 |

(Continued)

OTHER PUBLICATIONS

Combined Search and Examination Report dated Dec. 17, 2019 issued in United Kingdom Patent Application No. 1910275.5 (6 pages).

(Continued)

*Primary Examiner* — Tuan T Dinh
(74) *Attorney, Agent, or Firm* — Polsinelli PC

(57) ABSTRACT

A stretchable display device comprises a lower substrate; a plurality of island substrates where a plurality of pixels is defined, spaced apart from each other and disposed on the lower substrate and; a plurality of connecting lines electrically connected to a plurality of pads disposed on adjacent island substrates among the plurality of island substrates, wherein the plurality of connecting lines has a curved shape; and a plurality of conductive reinforcing members in contact with a portion of each connecting line.

19 Claims, 15 Drawing Sheets

(56) References Cited

U.S. PATENT DOCUMENTS

| | | | |
|---|---|---|---|
| 2009/0317639 A1* | 12/2009 | Axisa | H05K 1/0283 428/411.1 |
| 2010/0155757 A1 | 6/2010 | Kim et al. | |
| 2012/0051005 A1 | 3/2012 | Vanfleteren et al. | |
| 2012/0062447 A1 | 3/2012 | Tseng et al. | |
| 2012/0250323 A1 | 10/2012 | Velu | |
| 2013/0088662 A1 | 4/2013 | Watanabe et al. | |
| 2014/0131715 A1 | 5/2014 | Liu et al. | |
| 2014/0217382 A1* | 8/2014 | Kwon | H01L 51/5246 257/40 |
| 2014/0240932 A1* | 8/2014 | Hsu | H05K 1/0283 361/749 |
| 2014/0299362 A1 | 10/2014 | Park et al. | |
| 2014/0340857 A1* | 11/2014 | Hsu | A61B 5/6846 361/749 |
| 2015/0009129 A1 | 1/2015 | Song et al. | |
| 2015/0380355 A1 | 12/2015 | Rogers et al. | |
| 2016/0172428 A1 | 6/2016 | Song et al. | |
| 2016/0211483 A1 | 7/2016 | Kwon | |
| 2016/0260915 A1* | 9/2016 | Park | H01L 51/5281 |
| 2017/0005077 A1 | 1/2017 | Kim et al. | |
| 2017/0169918 A1 | 6/2017 | Part et al. | |
| 2017/0192319 A1 | 7/2017 | Zhang et al. | |
| 2017/0249886 A1 | 8/2017 | Choi | |
| 2018/0046221 A1 | 2/2018 | Choi et al. | |
| 2018/0090039 A1 | 3/2018 | Singireddy | |
| 2019/0019441 A1 | 1/2019 | Shin et al. | |
| 2019/0267440 A1 | 8/2019 | Park et al. | |
| 2019/0280248 A1 | 9/2019 | Kwon et al. | |
| 2020/0028102 A1 | 1/2020 | Kim et al. | |
| 2020/0051964 A1 | 2/2020 | Jung et al. | |
| 2020/0119290 A1 | 4/2020 | Shin | |

FOREIGN PATENT DOCUMENTS

| | | |
|---|---|---|
| EP | 3232743 A | 10/2017 |
| KR | 10-2014-0039572 A | 4/2014 |
| KR | 10-2015-0069079 A | 6/2015 |
| KR | 10-2016-0020034 A | 2/2016 |
| KR | 10-1647023 B1 | 8/2016 |
| KR | 10-2017-0034522 A | 3/2017 |
| KR | 10-2017-0061313 A | 6/2017 |
| KR | 10-2017-0110209 A | 10/2017 |
| KR | 10-2017-0111634 A | 10/2017 |
| KR | 10-2017-0112151 | 10/2017 |
| TW | 200424981 A | 11/2004 |

OTHER PUBLICATIONS

Combined Search and examination Report dated Dec. 17, 2019 issued in United Kingdom Patent Application No. 1915140.6 (5 pages).

* cited by examiner

STRETCHABLE DISPLAY DEVICE

CROSS-REFERENCE TO RELATED APPLICATION

This application claims the priority of Korean Patent Application No. 10-2018-0084928 filed on Jul. 20, 2018, in the Korean Intellectual Property Office, which is incorporated by reference in its entirety.

BACKGROUND

Field of the Disclosure

The present disclosure relates to a display device, and more particularly, a stretchable display device. Although the present disclosure is suitable for a wide scope of applications, it is particularly suitable for improving reliability that can suppress damage on signal lines even if the device is bent or stretched and can stably provide electrical signal even if the signal lines are damaged.

Description of the Background

An Organic Light Emitting Display (OLED) that emits light by itself, a Liquid Crystal Display (LCD) that requires separate light sources, etc. are used as the display devices used in a computer monitor, a TV, and a mobile phone.

Display devices are being applied to more and more varied fields including not only a computer monitor and a TV, but personal mobile devices, and a display device having a wide active area and reduced volume and weight is being studied.

Recently, a stretchable display device manufactured to be able to stretch/contract in a specific direction by users and change into various shapes by forming a display unit, lines, etc. on a flexible substrate such as plastic that is a flexible material has been spotlighted as a next generation display device.

SUMMARY

The present disclosure is to provide a stretchable display device that can be bent or stretched without damaging display elements disposed on a plurality of rigid substrates by disposing a plurality of rigid substrates on which a plurality of pixels is disposed and spaced over a flexible substrate.

In addition, the present disclosure is to provide a stretchable display device that can minimize damage to a connecting line even though the display device is bent or stretched by disposing a connecting line including conductive particles between a plurality of island substrates spaced apart from each other on which a plurality of pixel is defined.

The present disclosure is to provide a stretchable display device in which pads disposed on a plurality of island substrates are electrically connected with each other by conductive particles and the conductive particles can connect the pads in a straight shape, by including a base polymer and conductive particles distributed in an upper portion of the base polymer and having density that decreases with distance from the uppermost surface of the base polymer, each between a plurality of island substrates.

The present disclosure is to provide a stretchable display device that can improve or reduce damage to a connecting line by minimizing a physical step between several components on a plurality of island substrates and a lower substrate by connecting pads on a plurality of island substrates and including a conductive reinforcing member made of a metal material and disposed over or under the connecting line.

Further, the present disclosure is to provide a stretchable display device in which damage to a connecting line at a point where stress applied to the connecting line is maximized is minimized and electrical signal transmission can be smoothly maintained when the connecting line is damaged, by disposing a conductive reinforcing member over or under the connecting line at a peak area of a connecting line having a curved shape or at the inner edge of the peak area.

The present disclosure is not limited to the above-mentioned objects, and other objects, which are not mentioned above, can be clearly understood by those skilled in the art from the following descriptions.

In order to achieve the above-mentioned aspects, a stretchable display device comprises a lower substrate; a plurality of island substrates where a plurality of pixels is defined, spaced apart from each other and disposed on the lower substrate and; a plurality of connecting lines electrically connected to a plurality of pads disposed on adjacent island substrates among the plurality of island substrates, wherein the plurality of connecting lines has a curved shape; and a plurality of conductive reinforcing members in contact with a portion of each connecting line.

In another aspect of the present disclosure, a stretchable display device comprises a lower flexible substrate; a plurality of rigid substrates where a plurality of pixels is defined, spaced apart from each other and disposed on the lower flexible substrate; a plurality of connecting lines electrically connected to a plurality of pads disposed between adjacent rigid substrates among the plurality of rigid substrates, and are made of a same material as a plurality of conductive components disposed on the plurality of rigid substrates; and a plurality of conductive flexible layers disposed on one of a top surface and a bottom surface of the plurality of connecting lines.

Other detailed matters of the exemplary aspects are included in the detailed description and the drawings.

The present disclosure has an effect that since the plurality of island substrates that is rigid substrates is disposed on the lower substrate that is a flexible substrate, the stretchable display device can be easily bent or stretched.

The present disclosure has an effect that since the connecting lines connecting pads of the plurality of island substrates include a base polymer and conductive particles, even if the connecting lines are bent or stretched, the connecting lines are not easily damaged, electrical signals can be transmitted by the conductive particles, and the connecting lines can be formed in a straight shape.

The present disclosure has an effect that since the top surface of the base polymer of the connecting lines connecting the pads of the plurality of island substrates is made flat or formed to cover all the planarization layers on the island substrates, it is possible to maintain the flexible characteristic, reduce the process cost and time, and minimize damage to conductive paths formed by the conductive particles of the connecting lines.

The present disclosure has an effect that since the base polymer of the connecting lines connecting the pads of the plurality of island substrates is formed only in the areas overlapping the conductive particles of the connecting lines, conductive paths by adjacent conductive particles are connected to each other, so disconnection of each of the conductive paths can be minimized.

The present disclosure has an effect that since the conductive reinforcing members are disposed adjacent to the plurality of island substrates under or over the connecting lines having a curved shape, it is possible to minimize damage such as cracking of the connecting lines.

The present disclosure has an effect that since the conductive reinforcing members are disposed over or under the connecting lines in the peak areas of the connecting lines having a curved shape or at the inner edges of the peak areas, it is possible to minimize damage to the connecting lines due to stress applied to the connecting lines, and it is possible to suppress blocking of electrical signals when the connecting lines are damaged.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
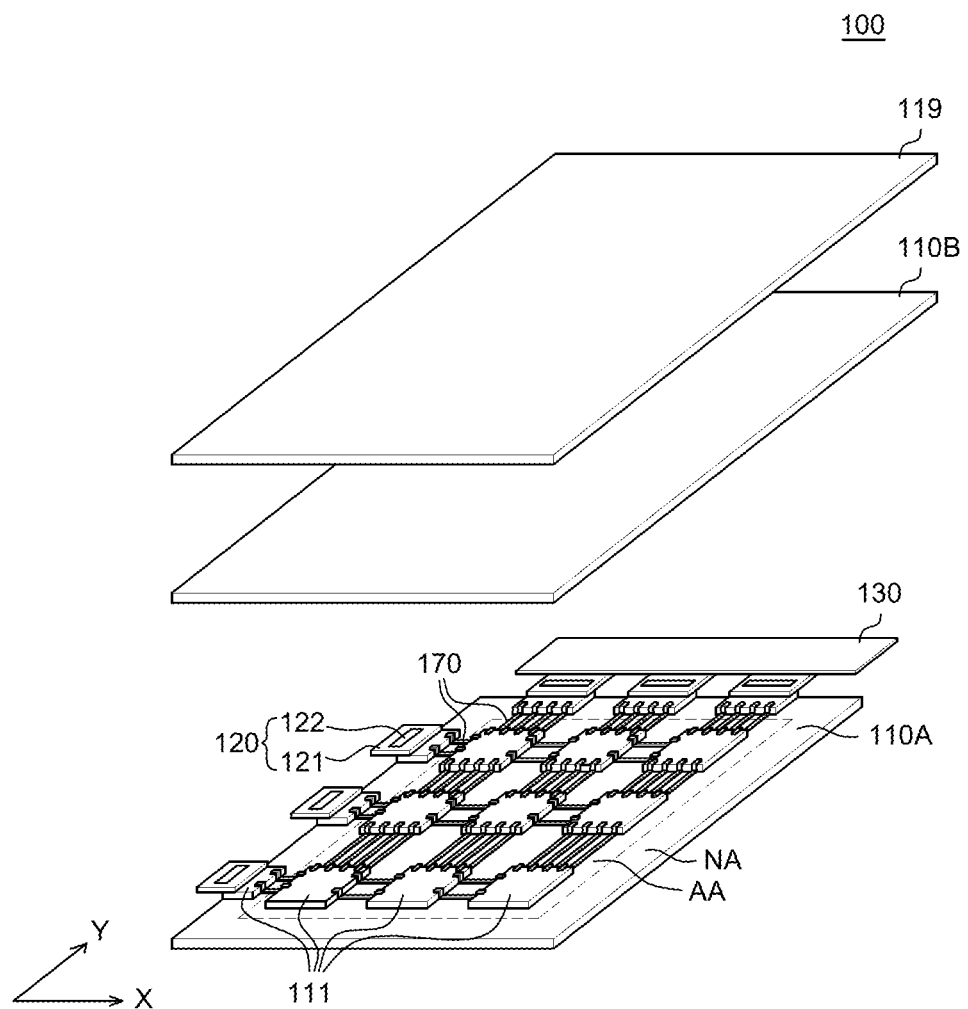
FIG. 1 is an exploded perspective view of a stretchable display device according to an aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween. The terms "lower", "higher", "upper", "bottom" and "top", where referring to spatial positioning, are referenced to the typical orientation from which the display is viewed. That is to say that "higher", "upper" and "top" are closer to the typical viewing surface than "lower" and "bottom".

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, exemplary aspects of the present disclosure will be described in detail with reference to accompanying drawings.

<Stretchable Display Device>

A stretchable display device may be referred to as a display device that can display images even if it is bent or stretched. A stretchable display device can have high flexibility, as compared with the conventional display devices. Accordingly, the shape of the stretchable display device can be freely changed in accordance with operation by a user such as bending and stretching the stretchable display device. For example, when the user holds and pulls an end of a stretchable display device, the stretchable display device can be stretched by the force of the user. Alternatively, when a user puts a stretchable display device on an uneven wall, the stretchable display device can be disposed to be bent in the surface shape of the wall. Further, when the force applied by a user is removed, a stretchable display device can return to the initial shape.

FIG. 1 is a plan view showing a display device according to an aspect of the present disclosure. Referring to FIG. 1, a stretchable display device 100 includes a lower substrate 110A, a plurality of island substrates 111, connecting lines 170, chip on films (COF) 120, a printed circuit board (PCB) 130, an upper substrate 110B, and a polarizing plate 119. An adhesive layer for bonding the lower substrate 110A and the upper substrate 110B are not shown in FIG. 1 for the convenience of description.

The lower substrate 110A is a substrate for supporting and protecting various components of the stretchable display device 100. The lower substrate 110A, which is a flexible substrate, may be made of a bendable or stretchable insulating material. For example, the lower substrate 110A may be made of silicon rubber such as polydimethylsiloxane (PDMS) and an elastomer such as polyurethane (PU), so it has flexibility. The material of the lower substrate 110A, however, is not limited thereto.

The lower substrate 110A, which is a flexible substrate, may be reversibly expandable and contractible. Further, an elastic modulus of the lower substrate 110A may be several to hundreds of MPa and a elongation fracture rate may be 100% or more. The thickness of the lower substrate 110A may be 10 μm to 1 mm, but is not limited thereto.

The lower substrate 110A may have an active area AA and a non-active area NA surrounding the active area AA.

The active area AA is an area where images are displayed on the stretchable display device 100, and display elements and various driving elements for driving the display elements are disposed in the active area AA. The active area AA includes a plurality of pixels (see, e.g., FIG. 2: "PX") including a plurality of subpixels (see, e.g., FIG. 2: "SPX"). The plurality of pixels is disposed in the active area AA and includes a plurality of display elements. The plurality of subpixels each may be connected with various lines that transfers electrical signals. For example, the plurality of subpixels each may be connected with various lines such as a gate line, a data line, a high-potential power line, a low-potential power line, and a reference voltage line.

The non-active area NA is an area adjacent to the active area AA. The non-active area NA may be an area disposed adjacent to the active area AA and surrounding the active area AA. The non-active area NA is an area where an image is not displayed, and lines, circuit units, etc. may be disposed in the non-active area NA. For example, a plurality of pads may be disposed in the non-active area NA and each of the pads may be connected with at least one subpixel of the plurality of subpixels in the active area AA.

The plurality of island substrates 111 on which a plurality of pixels are defined is disposed on the lower substrate 110A. The plurality of island substrates 111, which is rigid substrates, is spaced apart from each other and disposed on the lower substrate 110A. The plurality of island substrates 111 may be more rigid than the lower substrate 110A. That is, the lower substrate 110A may be softer or more flexible than the plurality of island substrates 111 and the plurality of island substrates 111 may be more rigid than the lower substrate 110A.

The plurality of island substrates 111, which is a plurality of rigid substrates, may be made of a plastic material having flexibility and, for example, may be made of polyimide (PI), etc.

The modulus of the plurality of island substrates 111 may be higher than that of the lower substrate 110A. The modulus is an elastic modulus showing a ratio of deformation of a substrate caused by stress applied to the substrate, and when the modulus is relatively high, the hardness may be relatively high. Accordingly, the plurality of island substrates 111 may be a plurality of rigid substrates that is more rigid than the lower substrate 110A. The modulus of the plurality of island substrates 111 may be a thousand times or more than that of the lower substrate 110A, but are not limited thereto.

The connecting lines 170 are disposed among the plurality of island substrates 111. The connecting lines 170 may be disposed between the pads disposed on the plurality of island substrates 111 and may electrically connect each pad. The connecting lines 170 will be described in more detail with reference to FIG. 2.

The COFs 120, which are films having various components on flexible base films 121, are components for supplying signals to the plurality of subpixels in the active area AA. The COFs 120 may be bonded to the plurality of pads disposed in the non-active area NA and supply a power voltage, a data voltage, a gate voltage, etc. to each of the plurality of subpixels in the active area AA through the pads. Each of the COFs 120 includes a base film 121 and a driving IC 122 and may include various other components.

The base films 121 are layers supporting the driving ICs 122 of the COFs 120. The base films 121 may be made of an insulating material, for example, an insulating material having flexibility.

The driving ICs 122 are components that process data for displaying images and driving signals for processing the data. Although the driving ICs 122 are mounted in the COF (120) in FIG. 1, the driving ICs 122 are not limited thereto and may be mounted in the type of chip on glass (COG), tape carrier package (TCP), etc.

Controllers such as an IC chip and a circuit may be mounted on the printed circuit board (PCB) 130. Further, a memory, a processor, etc. also may be mounted on the printed circuit board 130. The printed circuit board 130 is a configuration that transmits signals for driving the display elements from the controllers to the display elements.

The printed circuit board 130 is connected with the COFs 120, so they can be electrically connected with each of the plurality of subpixels on the plurality of island substrates 111.

The upper substrate 110B is a substrate overlapping the lower substrate 110A and protects various components of the stretchable display device 100. The upper substrate 110B, which is a flexible substrate, may be made of a bendable or stretchable insulating material. For example, the upper substrate 110B may be made of a flexible material and may be made of the same material as the lower substrate 110A, but is not limited thereto.

The polarizing plate 119, which is a configuration suppressing external light reflection of the stretchable display device 100, may be disposed on the upper substrate 110B while overlapping the upper substrate 110B. However, the polarizing plate 119 is not limited thereto and, may be disposed under the upper substrate 110B, or may be omitted, depending on the configuration of the stretchable display device 100.

FIGS. 2-3 and FIGS. 4A-4B are referred to describe in more detail the stretchable display device 100 according to an aspect of the present disclosure.

<Planar & Cross-Sectional Structures>

Figure 2:
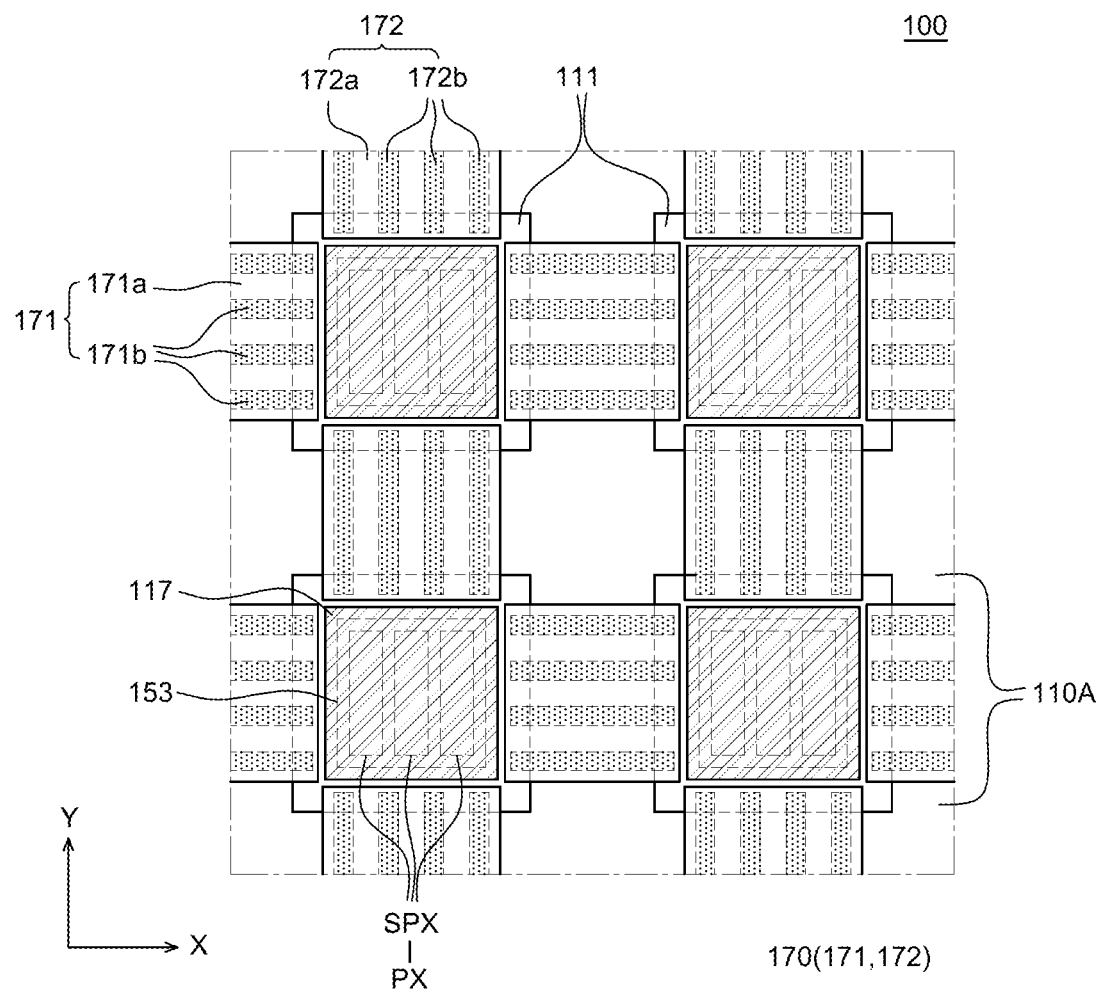
FIG. 2 is an enlarged plan view of the stretchable display device according to an aspect of the present disclosure.
Figure 3:
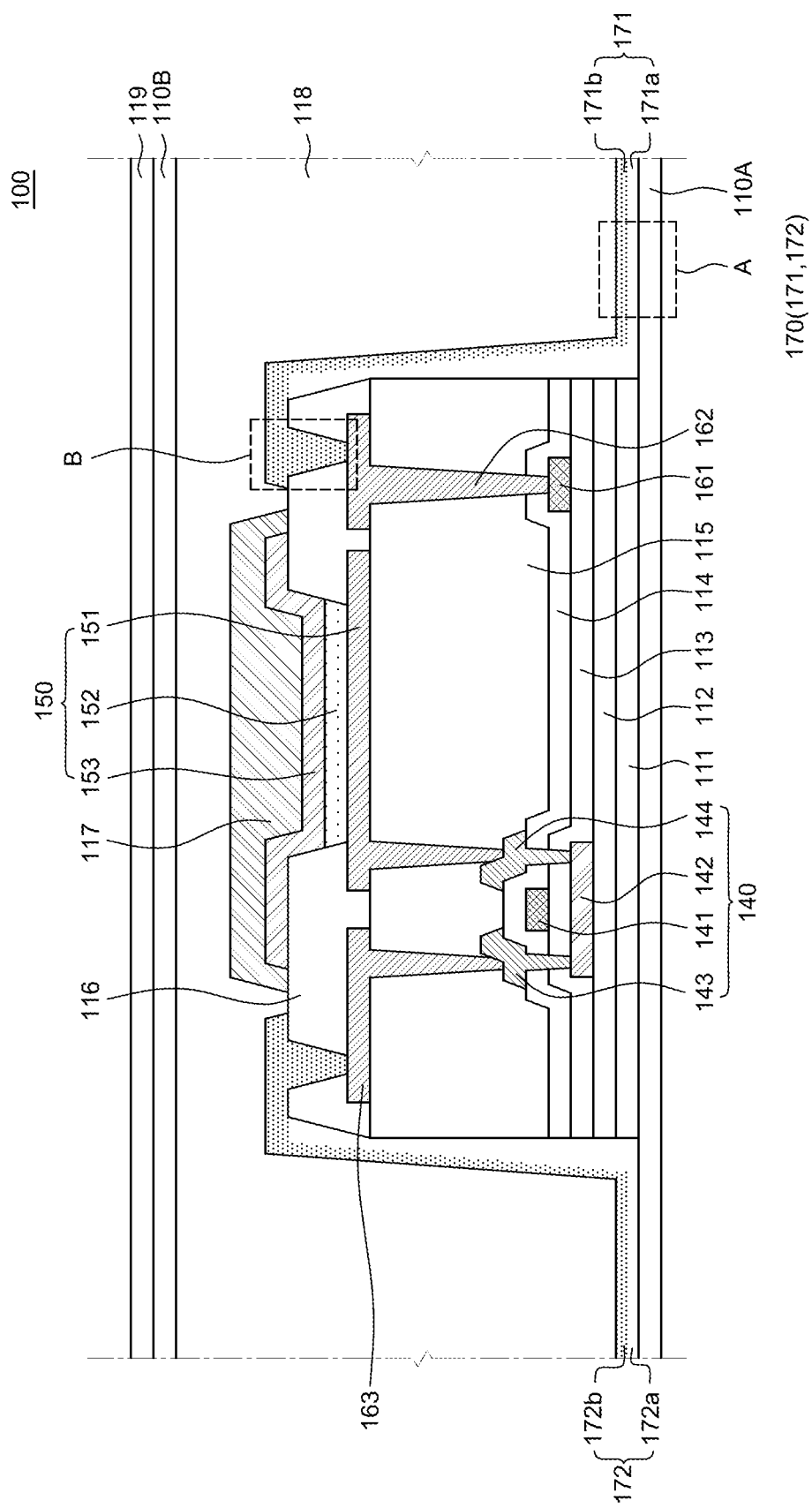
FIG. 3 is a schematic cross-sectional view of one subpixel of FIG. 1.
Figure 4A:
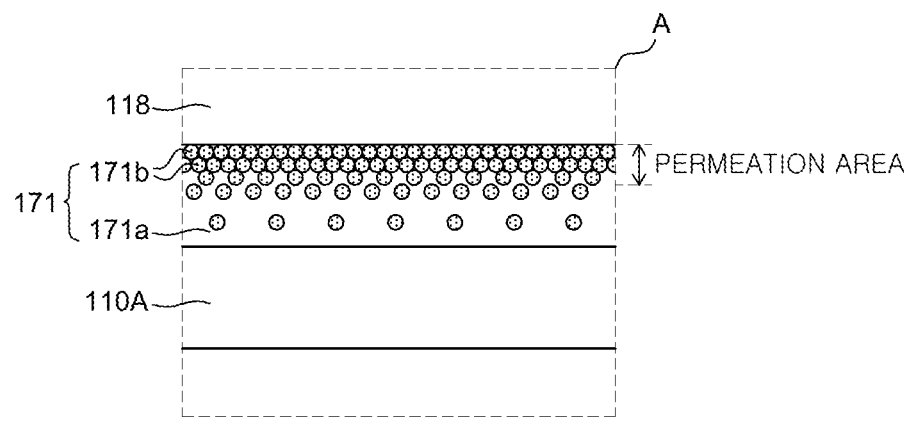
FIG. 4A and FIG. 4B are enlarged cross-sectional views of area A and area B of FIG. 3.
Figure 4B:
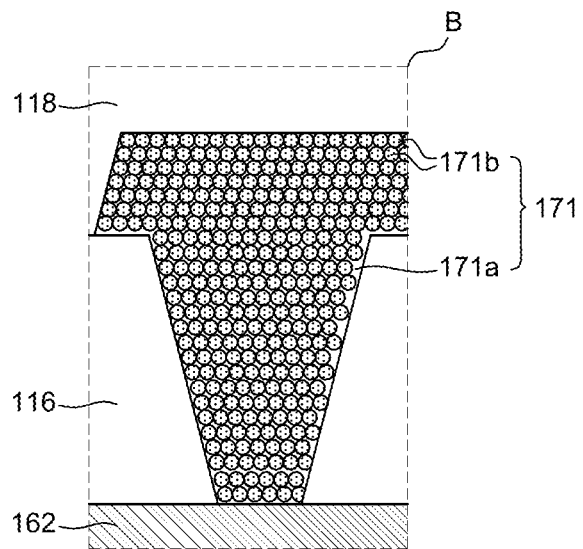

FIG. 2 is an enlarged plan view of the stretchable display device according to an aspect of the present disclosure. FIG. 3 is a schematic cross-sectional view of a subpixel of FIG. 1. FIG. 4A and FIG. 4B are enlarged cross-sectional views of area A and area B of FIG. 3.

Referring to FIGS. 2 and 3, the plurality of island substrates 111 is disposed on the lower substrate 110A. The plurality of island substrates 111 is spaced apart from each other and disposed on the lower substrate 110A. For example, the plurality of island substrates 111, as shown in FIGS. 1 and 2, may be disposed in a matrix shape on the lower substrate 110A, but is not limited thereto.

Referring to FIG. 3, a buffer layer 112 is disposed on the plurality of island substrates 111. The buffer layer 112 is formed on the plurality of island substrates 111 and protects various components of the stretchable display device 100 against permeation of water ($H_2O$) and oxygen ($O_2$) from the outside from the lower substrate 110A and the plurality of island substrates 111. The buffer layer 112 may be made of an insulating material, and for example, may be made of a single inorganic layer or a multi-inorganic layer made of a silicon nitride (SiNx), a silicon oxide (SiOx), silicon oxynitride (SiON), etc. However, the buffer layer 112 may be omitted, depending on the structure or characteristics of the stretchable display device 100.

The buffer layer 112 may be formed only in the areas overlapping the plurality of island substrates 111. As described above, since the buffer layers 112 may be made of an inorganic material, they may be easily damaged, such as cracking, when the stretchable display device 100 is stretched. Accordingly, the buffer layer 112 is patterned in the shape of the plurality of island substrates 111 without being formed in the areas between the plurality of island substrates 111, and it can be formed only over the plurality of island substrates 111. Therefore, since the buffer layer 112 is formed only in the areas overlapping the plurality of island substrates 111 that is the rigid substrates, it is possible to suppress damage to the buffer layer 112 even though the stretchable display device 100 according to an aspect of the present disclosure is deformed, such as, bending or stretching.

Referring to FIG. 3, a transistor 140 including a gate electrode 141, an active layer 142, a source electrode 143, and a drain electrode 144 is formed on the buffer layer 112. For example, the active layer 142 is formed on the buffer layer 112, and a gate insulating layer 113 for insulating the active layer 142 and the gate electrode 141 from each other is formed on the active layer 142. An inter-layer insulating layer 114 is formed to insulate the gate electrode 141, the source electrode 143, and the drain electrode 144 from each other, and the source electrode 143 and the drain electrode 144 that are in contact with the active layer 142 are formed on the inter-layer insulating layer 114.

The gate insulating layer 113 and the inter-layer insulating layer 114 may be formed only in the areas overlapping the plurality of island substrates 111 by patterning. The gate insulating layer 113 and the inter-layer insulating layer 114 may also be made of an inorganic material, as may the buffer layer 112, so they may be easily damaged such as cracking when the stretchable display device 100 is stretched. Accordingly, the gate insulating layer 113 and the inter-layer insulating layer 114 are patterned to have the shape of the plurality of island substrates 111 without being formed in the areas between the plurality of island substrates 111, whereby they can be formed only on the plurality of island substrates 111.

Only a driving transistor of various transistors that may be included in the stretchable display device 100 is shown in FIG. 3 for the convenience of description, but a switching transistor, a capacitor, etc. may be included in the display device. Further, although the transistor 140 is described as having a coplanar structure in this specification, various transistors, for example, having a staggered structure also may be used.

Referring to FIG. 3, a gate pad 161 is disposed on the gate insulating layer 113. The gate pad 161 is a pad for transmitting a gate signal to a plurality of subpixels SPX. The gate pad 161 may be made of the same material as the gate electrode 141, but is not limited thereto.

Referring to FIG. 3, a planarization layer 115 is formed on the transistor 140 and the inter-layer insulating layer 114. The planarization layer 115 planarizes the top of the transistor 140. The planarization layer 115 may be composed of a single layer or a plurality of layers and may be made of an organic material. For example, the planarization layer 115 may be made of an acrylic-based organic material, but is not limited thereto. The planarization layer 115 may have a contact hole for electrically connecting the transistor 140 and an anode 151, a contact hole for electrically connecting a data pad 163 and the source electrode 143, and a contact hole for electrically connecting a connecting pad 162 and a gate pad 161.

In some aspects, a passivation layer may be formed between the transistor 140 and the planarization layer 115. That is, a passivation layer covering the transistor 140 may be formed to protect the transistor 140 from permeation of water, oxygen, etc. The passivation layer may be made of an inorganic material and may be composed of a single layer or a multi-layer, but is not limited thereto.

Referring to FIG. 3, the data pad 163, the connecting pad 162, and the organic light emitting element 150 are disposed on the planarization layer 115.

The data pad 163 can transmit a data signal from a connecting line 170, which functions as a data line, to a plurality of subpixels SPX. The data pad 163 is connected with the source electrode 143 of the transistor 140 through a contact hole formed at the planarization layer 115. The data pad 163 may be made of the same material as the anode 151 of the organic light emitting element 150, but is not limited thereto. Further, the data pad 163 may be made of the same material as the source electrode 143 and the drain electrode 144 of the transistor 140, not on the planarization layer 115, but on the inter-layer insulating layer 114.

The connecting pad 162 may transmit a gate signal from a connecting line 170, which functions as a gate line, to a plurality of subpixels SPX. The connecting pad 162 is connected with the gate pad 161 through contact holes formed at the planarization layer 115 and the inter-layer insulating layer 114 and transmits a gate signal to the gate pad 161. The connecting pad 162 may be made of the same material as the data pad 163, but is not limited thereto.

The organic light emitting elements 150 are components disposed to correspond to a plurality of subpixels SPX, respectively, and emit light having a specific wavelength band. That is, the organic light emitting element 150 may be a blue organic light emitting element that emits blue light, a red organic light emitting element that emits red light, a green organic light emitting element that emits green light, or a white organic light emitting element that emits white light, but is not limited thereto. When the organic light emitting element 150 is a white organic light emitting element, the stretchable display device 100 may further include a color filter.

The organic light emitting element 150 includes an anode 151, an organic light emitting layer 152, and a cathode 153. In detail, the anode 151 is disposed on the planarization layer 115. The anode 151 is an electrode configured to supply holes to the organic light emitting layer 152. The anode 151 may be made of a transparent conductive material with a high work function. The transparent conductive material may include indium tin oxide (ITO), indium zinc oxide (IZO), or indium tin zinc oxide (ITZO). The anode 151 may be made of the same material as the data pad 163 and the connecting pad 162 disposed on the planarization layer 115, but is not limited thereto. Further, when the stretchable display device 100 is implemented as a top emission type, the anode 151 may further include a reflective plate.

The anodes 151 are spaced apart from each other respectively for subpixels SPX and electrically connected with the transistor 140 through a contact hole of the polarization layer 115. For example, although the anode 151 is electrically connected with the drain electrode 144 of the transistor 140 in FIG. 3, it may be electrically connected with the source electrode 143.

A bank 116 is formed on the anode 151, the data pad 163, the connecting pad 162, and the planarization layer 115. The bank 116 is a component separating adjacent subpixels SPX. The bank 116 is disposed to cover at least partially both sides of adjacent anodes 151, thereby partially exposing the top of the anode 151. The bank 116 may suppress the problem that an unexpected subpixel SPX emits light or colors are mixed by light emitted in the lateral direction of the anode 151 due to concentration of a current on the corner of the anode 151. The bank 116 may be made of acrylic-based resin, benzocyclobutene (BCB)-based resin, or polyimide, but is not limited thereto.

The bank 116 has a contact hole for connecting the connecting line 170 functioning as a data line and the data pad 163 and a contact hole for connecting the connecting line 170 functioning as a gate line and the connecting pad 162.

The organic light emitting layer 152 is disposed on the anode 151. The organic light emitting layer 152 is configured to emit light. The organic light emitting layer 152 may include a luminescent material, and the luminescent material may include a phosphorous material or a fluorescent material, but is not limited thereto.

The organic light emitting layer 152 may be composed of one light emitting layer. Alternatively, the organic light emitting layer 152 may have a stacked structure in which a plurality of light emitting layers is stacked with a charge generation layer therebetween. The organic light emitting layer 152 may further include at least one organic layer of a hole transporting layer, an electron transporting layer, a hole blocking layer, an electrode blocking layer, a hole injection layer, and an electron injection layer.

Referring to FIGS. 2 and 3, the cathode 153 is disposed on the organic light emitting layer 152. The cathode 153 supplies electrons to the organic light emitting layer 152. The cathode 153 may be made of indium tin oxide (ITO)-based, indium zin oxide (IZO)-based, indium tin zinc oxide (ITZO)-based, zinc oxide (ZnO)-based, or tin oxide (TO)-based transparent conductive oxides or an ytterbium (Yb) alloy. Alternatively, the cathode 153 may be made of a metal material.

The cathodes 153 may be formed by patterning to respectively overlap the plurality of island substrates 111. That is, the cathodes 153 may be disposed not in the areas between the plurality of island substrates 111, but only in the areas overlapping the plurality of island substrates 111. Since the cathodes 153 are made of a transparent conductive oxide, a metal material, etc., when the cathodes 153 are formed even in the areas between the plurality of island substrates 111, the cathodes 153 may be damaged when the stretchable display device 100 is stretched/contracted. Accordingly, the cathodes 153 may be formed to respectively correspond to the plurality of island substrates 111 on the plane. Referring to FIGS. 2 and 3, the cathodes 153 may be formed to have an area not overlapping the area where a connection line 170 is disposed, of the areas overlapping the plurality of island substrates 111.

Unlike the conventional organic light emitting display devices, the cathodes 153 are formed by patterning to correspond to the plurality of island substrate 111 in the stretchable display device 100 according to an aspect of the present disclosure. Accordingly, each of the cathodes 153 disposed on the plurality of island substrates 111 may be independently supplied with low-potential power through the connecting lines 170.

Referring to FIGS. 2 and 3, an encapsulation layer 117 is disposed on the organic light emitting element 150. The encapsulation layer 117 may seal the organic light emitting element 150 by covering the organic light emitting element 150 in contact with a portion of the top surface of the bank 116. Accordingly, the encapsulation layer 117 protects the organic light emitting element 150 from water, air, or physical shock that may permeate from the outside.

A plurality of encapsulation layers 117 respectively cover the cathodes 153 patterned to respectively overlap the plurality of island substrate 111 and may be formed on the plurality of island substrates 111, respectively. That is, each encapsulation layer 117 is disposed to cover one cathode 153 on one island substrate 111 and the plurality of encapsulation layers 117 disposed on each of the plurality of island substrates 111 may be spaced apart from each other.

The encapsulation layer 117 may be formed only in the areas overlapping the plurality of island substrates 111. As described above, since the encapsulation layers 117 may be configured to include an inorganic layer, they may be easily damaged, such as cracking, when the stretchable display device 100 is stretched. In particular, since the organic light emitting element 150 is vulnerable to water or oxygen, when the encapsulation layer 117 is damaged, reliability of the organic light emitting element 150 may be reduced. Therefore, since the encapsulation layer 117 is not formed in the areas between the plurality of island substrates 111, damage to the encapsulation layer 117 may be minimized even though the stretchable display device 100 according to an aspect of the present disclosure is deformed, such as, bending or stretching.

Comparing the stretchable display device 100 according to an aspect of the present disclosure with common flexible organic light emitting display devices of the related art, the stretchable display device 100 according to an aspect of the present disclosure has a structure in which the plurality of island substrates 111 that are relatively rigid is spaced apart from each other and disposed on the lower substrate 110A that is relatively soft or flexible. The cathodes 153 and the encapsulation layers 117 of the stretchable display device 100 are disposed by patterning to correspond to the plurality of island substrates 111, respectively. That is, the stretchable display device 100 according to an aspect of the present disclosure may have a structure that enables the stretchable display device 100 to be more easily deformed when a user stretches or bends the stretchable display device 100 and may have a structure that may minimize damage to the components of the stretchable display device 100 when the stretchable display device 100 is deformed.

<Connecting Lines Composed of Base Polymer & Conductive Particles>

The connecting lines 170 are lines that electrically connect the pads on the plurality of island substrates 111. The connecting lines 170 include first connecting lines 171 and second connecting lines 172. The first connecting lines 171 are lines extending in an X-axis direction of the connecting lines 170 and the second connecting lines 172 are lines extending in a Y-axis direction of the connecting lines 170. The X-axis direction and Y-axis direction are positioned in a plane parallel to the display surface and are referenced to the typical viewing orientation.

In the conventional organic light emitting display devices, various lines such as a plurality of gate lines and a plurality of data lines are extended and disposed between a plurality of subpixels, and a plurality of subpixels is connected to one signal line. Accordingly, in the conventional organic light emitting display devices, various lines such as gate lines, data lines, high-potential power lines, and reference voltage lines extend continuously from one side to another side of the organic light emitting display device on the substrate.

However, in the stretchable display device 100 according to an aspect of the present disclosure, various lines such as gate lines, data lines, high-potential power lines, and reference voltage lines, which are made of a metal material, are disposed only on the plurality of island substrates 111. That is, in the stretchable display device 100 according to an aspect of the present disclosure, various lines made of a metal material may be disposed only on the plurality of island substrates 111 and may not be formed to be in contact with the lower substrate 110A. Accordingly, various lines may be patterned to correspond to the plurality of island substrates 111 and discontinuously disposed.

In the stretchable display device 100 according to an aspect of the present disclosure, the pads on two adjacent island substrates 111 may be connected by a connecting line 170 to connect the discontinuous lines. That is, a connecting line 170 electrically connects the pads on two adjacent island substrates 111. Accordingly, the stretchable display device 100 of the present disclosure includes a plurality of connecting lines 170 to electrically connect various lines such as gate lines, data lines, high-potential power lines, and reference voltage lines between the plurality of island substrates 111. For example, gate lines may be disposed on a plurality of island substrates 111 disposed adjacent to each other in the X-axis direction, and the gate pad 161 may be disposed at both ends of the gate lines. Each of the plurality of gate pads 161 on the plurality of island substrates 111 disposed adjacent to each other in the X-axs direction may be connected to each other by a connecting line 170 functioning as a gate line. Accordingly, the gate lines disposed on the plurality of island substrates 111 and the connecting lines 170 disposed on the lower substrate 110A may function as one gate line. Further, all various lines that may be included in the stretchable display device 100, such as the data lines, high-potential power lines, and reference voltage lines, also each may function as one line by a connecting line 170, as described above.

Referring to FIG. 2, a first connecting line 171 may connect corresponding pads on two island substrates 111 of the plurality of island substrates 111 disposed adjacent to each other and in a plane parallel to in the X-axial direction (referred to as X-axis parallel). The first connecting line 171 may function as a gate line or a low-potential power line, but is not limited thereto. For example, the first connecting line 171 may function as a gate line and may electrically connect the gate pads 161 on two X-axis parallel island substrates 111 through a contact hole formed at the bank 116. Accordingly, as described above, the gate pads 161 on a plurality of island substrates 111 disposed parallel to the X-axs direction may be connected by first connecting lines 171 that function as gate lines, and one gate signal may be transmitted.

Referring to FIG. 2, a second connecting line 172 may connect corresponding pads on two island substrates 111 of the plurality of island substrates 111 disposed adjacent to each other and in a plane parallel to the Y-axis direction (referred to as Y-axis parallel). The second connecting line 172 may function as a data line, a high-potential power line, or a reference voltage line, but is not limited thereto. For example, the second connecting line 172 may function as a data line and may electrically connect the data pads 163 on two Y-axis parallel island substrates 111 through a contact hole formed at the bank 116. Accordingly, as described above, the data pads 163 on a plurality of island substrates 111 disposed parallel to the Y-axis1 direction may be connected by the plurality of second connecting lines 172 that functions as data lines, and one data signal may be transmitted.

Referring to FIG. 2, the connecting line 170 includes a base polymer and conductive particles. In detail, the first connecting line 171 includes a base polymer 171a and conductive particles 171b and the second connecting line 172 includes a base polymer 172a and conductive particles 172b.

The base polymers 171a and 172a, similar to the lower substrate 110A, may be made of an insulating material that may be bent or stretched. The base polymers 171a and 172a, for example, may include styrene butadiene styrene (SBS), etc., but are not limited thereto. Accordingly, when the stretchable display device 100 is bent or stretched, the base polymers 171a and 172a may not be damaged.

The base polymers 171a and 172a are formed in a single layer on the lower substrate 110A between adjacent island substrates 111. In detail, the base polymers 171a and 172a are disposed in a single layer in contact with the lower substrate 110A in areas between most adjacent island substrates 111 in the X-axis direction (171a) and the Y-axis direction (172a) respectively. The base polymers 171a and 172a may be formed by coating a material for the base polymers 171a and 172a or applying the material using a slit to the top surface of the lower substrate 110A and the island substrate 111.

<Straight Disposing of Conductive Particles>

Referring to FIG. 2, the conductive particles 171b and 172b may connect in a straight line the pads disposed on adjacent island substrates 111 in the base polymers 171a and 172a. For this, in the manufacturing process, the conductive particles 171b and 172b are injected in a straight line on the base polymers 171a and 172a, and accordingly, the conductive particles 171b and 172b may be disposed in a straight line between the pads disposed respectively on the island substrates 111 spaced apart from each other and adjacent to each other over the base polymers 171a and 172a. Accordingly, the conductive path formed by the conductive particles 171b and 172b also may be straight.

The first connecting line 171 includes the base polymer 171a and the conductive particles 171b. The base polymer 171a may extend to the top surface of the lower substrate 110A in contact with the top surface and a side of the bank 116 disposed on the island substrate 111, and sides of the planarization layer 115, the inter-layer insulating layer 114, the buffer layer 112, and a plurality of island substrates 111.

Accordingly, the base polymer 171a may be in contact with the top surface of the lower substrate 110A, a side of an adjacent island substrate 111, and sides of the buffer layer 112, the gate insulating layer 113, the inter-layer insulating layer 114, the planarization layer 115, and the bank 116 disposed on the adjacent island substrate 111. The base polymer 171a may be in contact with the connecting pads 162 disposed on adjacent island substrates 111, but is not limited thereto.

Referring to FIG. 4A and FIG. 4B, the conductive particles 171b are distributed and disposed in the base polymer 171a and may form a conductive path electrically connecting the connecting pads 162 respectively disposed on island substrates 111 adjacent to each other. Further, it is possible to form a conductive path by electrically connecting a gate pad 161 formed on the outermost island substrate 111 of the plurality of island substrates 111 to a pad disposed in the non-active area.

The conductive particles 171b may be injected and distributed in the base polymer 171a by ink-printing, which uses conductive precursors, etc. on the top surface of the base polymer 171a. When the conductive particles 171b are injected into the base polymer 171a, the conductive particles 171b may permeate into an empty space of the base polymer 171a while the polymer swells several times. Thereafter, the connecting line 171 may be formed by dipping the base polymer 171a with the conductive particles 171b injected into a reducing material or by reducing the base polymer by vapor. The conductive particles 171b may include at least one of silver (Ag), gold (Au), and carbon, but are not limited thereto.

Referring to FIG. 2, the base polymer 171a may be disposed in one layer in the area between the plurality of island substrates 111. And, the conductive particles 171b may be disposed while forming a plurality of conductive paths on the base polymer 171a disposed in one layer. In detail, the base polymer 171a may be formed to overlap all of a plurality of connecting pads 162 disposed on a side of one island substrate 111. And, the conductive particles 171b may be separately formed to respectively correspond to the plurality of connecting pads 162 and may form a plurality of conductive paths electrically connected respectively with the connecting pads 162 overlapping the base polymer 171a. For example, as shown in FIG. 2, the conductive particles 171b may be injected to form four conductive paths on the top surface of the base polymer 171a disposed in one layer between the plurality of island substrates 111.

<Density Gradient of Conductive Particles>

Referring to FIG. 4A, the conductive particles 171b are distributed and disposed with a density gradient in the base polymer 171a. The density of conductive particles 171b increases towards the upper portion of a base polymer 171a, so conductivity by conductive particles 171b may be maximum at the upper portion of a base polymer 171a. In detail, each of the conductive particles 171b may be in contact with each other at the upper portion of the base polymer 171a, so a conductive path is formed by the conductive particles 171b being in contact with each other, and accordingly, an electrical signal may be transmitted.

Referring to FIG. 4A, the density of the conductive particles 171b in a permeation area at the upper portion of the base polymer 171a may be high such that the conductive particles 171b may form a conductive path. The density of the conductive particles 171b distributed in the permeation area of the base polymer 171a may be higher than the density of the conductive particles 171b in the other area of the base polymer 171a. Accordingly, a conductive path may be formed and an electrical signal may be transmitted by the conductive particles 171b distributed in the permeation area.

The thickness of the permeation area in which the conductive particles 171b are distributed with high density at the upper portion of the base polymer 171a may be changed in accordance with the time and intensity of injecting the conductive particles 171b into the top surface of the base polymer 171a. When the time or intensity of injecting the conductive particles 171b on the top surface of the base polymer 171a is increased, the thickness of the permeation area may be increased.

Referring to FIG. 4B, the conductive particles 171b distributed in the base polymer 171a in an area B in which the first connecting line 171 and the connecting pad 162 are in contact may have substantially the same density at the upper portion of the base polymer 171a and at the lower portion of the base polymer 171a. As described above, the conductive particles 171b may be injected through the top surface of the base polymer 171a and distributed at the upper portion of the base polymer 171a. At this time, for example, by increasing the time of the process of injecting the conductive particles 171b, the conductive particles 171b may be distributed with the same density at the upper portion and the lower portion of the base polymer 171a, but are not limited thereto.

Referring to FIG. 2, the second connecting line 172 includes the base polymer 172a and the conductive particles 172b. The base polymer 172a may extend to the top surface of the lower substrate 110A in contact with the top surface and a side of the bank 116 disposed on the island substrate 111, and sides of the planarization layer 115, the inter-layer insulating layer 114, the buffer layer 112, and a plurality of island substrates 111. Accordingly, the base polymer 172a may be in contact with the top surface of the lower substrate 110A, a side of an adjacent island substrate 111, and sides of the buffer layer 112, the gate insulating layer 113, the inter-layer insulating layer 114, the planarization layer 115, and the bank 116 disposed on the adjacent island substrate 111. The base polymer 172a may be in contact with the data pads 163 disposed on adjacent island substrates 111, but is not limited thereto.

The conductive particles 172b are disposed to be distributed in the base polymer 172a, thereby being able to form a conductive path electrically connecting the data pads 163 respectively disposed on adjacent island substrates 111. Further, the conductive particles may form a conductive path by electrically connecting a data pad 163 formed on the outermost island substrate 111 of the plurality of island substrate 111 to a pad disposed in the non-active area. The process in which the conductive particles 172b are distributed in the base polymer 172a is the same as the process described about the first connecting line 171, so repeated description is omitted. Further, the processes of distributing the conductive particles 171b and 172b into the base polymers 171a and 172a may be simultaneously performed.

Referring to FIG. 2, the base polymer 172a may be disposed in one layer in the area between the plurality of adjacent island substrates 111. And, the conductive particles 172b may be disposed while forming a plurality of conductive paths on the base polymer 172a disposed in one layer. In detail, the base polymer 172a may be formed to overlap all of a plurality of data pads 163 on a side on one island substrate 111. And, the conductive particles 172b may form a plurality of conductive paths respectively electrically connected with the plurality of data pads 163 overlapping the base polymer 172a.

Referring to FIG. 3, the conductive particles 172b are distributed and disposed with a density gradient in the base polymer 172a. The density of conductive particles 172b decreases as it goes from the upper portion of a base polymer 172a toward the lower portion of the base polymer 127a, so conductivity by conductive particles 172b may be maximum at the upper portion of a base polymer 172a. In detail, each of the conductive particles 172b may be in contact with each other at the upper portion of the base polymer 172a, so a conductive path is formed by the conductive particles 172b being in contact with each other, and accordingly, an electrical signal may be transmitted. The description about the density gradient and the conductive path of the conductive particles 172b is the same as the description about the conductive particles 171b, so repeated description is omitted.

Meanwhile, the conductive particles 172b, unlike those shown in FIGS. 3 to 4B, may be distributed and disposed without a density gradient in the base polymer 172a. The density of the conductive particles 172b disposed at the upper portion of the base polymer 172a and the density of the conductive particles 172b disposed at the lower portion of the base polymer 172a may be the same. However, they are not limited thereto.

Referring back to FIG. 3, the upper substrate 110B, the polarizing plate 119, and the adhesive layer 118 are disposed on the encapsulation layer 117 and the lower substrate 110A. The upper substrate 110B is a substrate supporting various components disposed under the upper substrate 110B. The upper substrate 110B and the lower substrate 110A may be bonded through the adhesive layer 118 disposed under the upper substrate 110B by applying pressure to the upper substrate 110B and the lower substrate 110A.

The polarizing plate 119 is disposed on the upper substrate 110B. The polarizing plate 119 may polarize light incident into the stretchable display device 100 from the outside. Light incident and polarized in the stretchable display device 100 through the polarizing plate 119 may be reflected in the stretchable display device 100, so the phase of the light may be changed. The light with the changed phase may not pass through the polarizing plate 119. Accordingly, light incident in the stretchable display device 100 from the outside of the stretchable display device 100 is not discharged back to the outside of the stretchable display device 100, so the external light reflection of the stretchable display device 100 may be reduced.

<Stretching Characteristic by Plurality of Island Substrates>

A stretchable display device needs an easy bending or stretching characteristic, so there have been attempts to use substrates that have a flexible property due to a small modulus. However, when a flexible material such as polydimethylsiloxane (PDMS) having a small modulus is used as a lower substrate that is disposed in the process of manufacturing display elements, there is a problem that the substrate is damaged by high temperature, for example, temperature over 100° C. that is generated in the process of forming transistors and the display elements due to the characteristic that a material having a small modulus tends to be weak against heat.

Accordingly, display elements should preferably be formed on a substrate made of a material that can withstand high temperature, so damage to the substrate can be suppressed in the process of manufacturing the display elements. Accordingly, there have been attempts to manufacture a substrate using materials that can withstand high temperature, which is generated in the manufacturing process, such as polyimide (PI). However, the materials that can withstand high temperature do not have flexible properties due to large moduli, so substrates are not easily bent or stretched when the stretchable display devices are stretched.

Therefore, since the plurality of island substrates 111 that is rigid substrates is disposed only in the areas where transistors 140 or organic light emitting elements 150 are disposed in the stretchable display device 100 according to an aspect of the present disclosure, damage to the plurality of island substrates 111 due to high temperature in the process of manufacturing the transistors 140 or the organic light emitting elements 150 may be suppressed.

Further, the lower substrate 110A that is a flexible substrate may be disposed under the plurality of island substrates 111 in the stretchable display device 100 according to an aspect of the present disclosure. Accordingly, the other areas of the lower substrate 110A except the areas overlapping the plurality of island substrates 111 may be easily stretched or bent, so the stretchable display device 100 may be achieved. Further, it is possible to suppress the damage of the stretchable display device 100 by the transistors 140, the organic light emitting elements 150, etc. disposed on the plurality of island substrates 111 that is rigid substrates when the stretchable display device 100 is bent or stretched.

<Effect of Connecting Lines>

Meanwhile, when a stretchable display device is bent or stretched, a lower substrate that is a flexible substrate is deformed and island substrates that are rigid substrates on which organic light emitting elements are disposed may not be deformed. In this case, if the lines connecting the pads disposed on the plurality of island substrates are not made of an easily bendable or stretchable material, the lines may be damaged, such as cracking, due to deformation of the lower substrate.

In the stretchable display device 100 according to an aspect of the present disclosure, it is possible to electrically connect the pads disposed on each of the plurality of island substrates 111, using the connecting lines 170 including the base polymers 171a and 172a and the conductive particles 171b and 172b. The base polymer 171a and 172a are disposed in the areas between the plurality of island substrates 111 and are soft or flexible to be able to easily deform. Accordingly, the stretchable display device 100 of an aspect of the present disclosure has an effect that even though the stretchable display device 100 is deformed such as bending or stretching, the areas between the plurality of island substrates 111 on which the base polymers 171a and 172a are disposed may be easily deformed.

Further, in the stretchable display device 100 of an aspect of the present disclosure, since the connecting lines 170 include the conductive particles 171b and 172b, damage such as cracking may not be generated in the conductive path formed on the base polymers 171a and 172a by the conductive particles 171b and 172b even by deformation of the base polymers 171a and 172a. For example, when the stretchable display device 100 is deformed such as bending or stretching, the lower substrate 110A that is a flexible substrate may be deformed in the other areas excepting the areas where the plurality of island substrates 111 that is rigid substrates is disposed. At this time, the distance between the plurality of conductive particles 171b and 172b disposed in some area of the deforming lower substrate 110A may be changed. At this time, the density of the plurality of conductive particles 171b and 172b disposed at the upper portion of the base polymers 171a and 172a and forming conductive paths may be maintained to be high such that electrical signals may be transmitted even though the distance between the plurality of conductive particles 171b and 172b is increased. Accordingly, even if the base polymers 171a and 172a are bent or stretched, the conductive paths formed by the plurality of conductive particles 171b and 172b may still transmit electrical signals. Further, even though the stretchable display device 100 is deformed such as bending or stretching, electrical signals may be transmitted between the pads.

In the stretchable display device 100 according to an aspect of the present disclosure, the conductive particles 171b and 172b connecting each pad disposed on the plurality of island substrates 111 adjacent to each other make a shortest distance, that is, are distributed in a straight line in the base polymers 171a and 172a, so the stretchable display device 100 may be implemented even though the connecting lines 170 are not formed in a curved shape. The conductive particles 171b and 172b of the connecting lines 170 form a conductive path by being distributed at the upper portion of the base polymer 171a and 172a. Further, when the stretchable display device 100 is deformed such as bending or stretching, the conductive paths formed by the conductive particles 171b and 172b may be bent or stretched. In this case, only the distance between the conductive particles 171b and 172b is changed and the conductive paths formed by the conductive particles 171b and 172b may still transmit electrical signals.

Further, when the conductive particles 171b and 172b of the connecting lines 170 are distributed not in a straight line, but in curved shape, the force of deforming into a straight line may be generated in the conductive particles 171b and 172b distributed in the curved shape. Accordingly, in the stretchable display device 100 according to an aspect of the present disclosure, by distributing the conductive particles 171b and 172b of the connecting lines 170 in a straight line, it is possible to remove any force that may be generated by distributing the conductive particles 171b and 172b in a curved shape Accordingly, in the stretchable display device 100 according to an aspect of the present disclosure, it is possible to minimize deformation of the connecting lines 170, maintain the adhesive force between the connecting lines 170 and other components, and minimize the space that the connecting lines 170 occupy.

<Connecting Lines for Compensating for Step>

Figure 5:
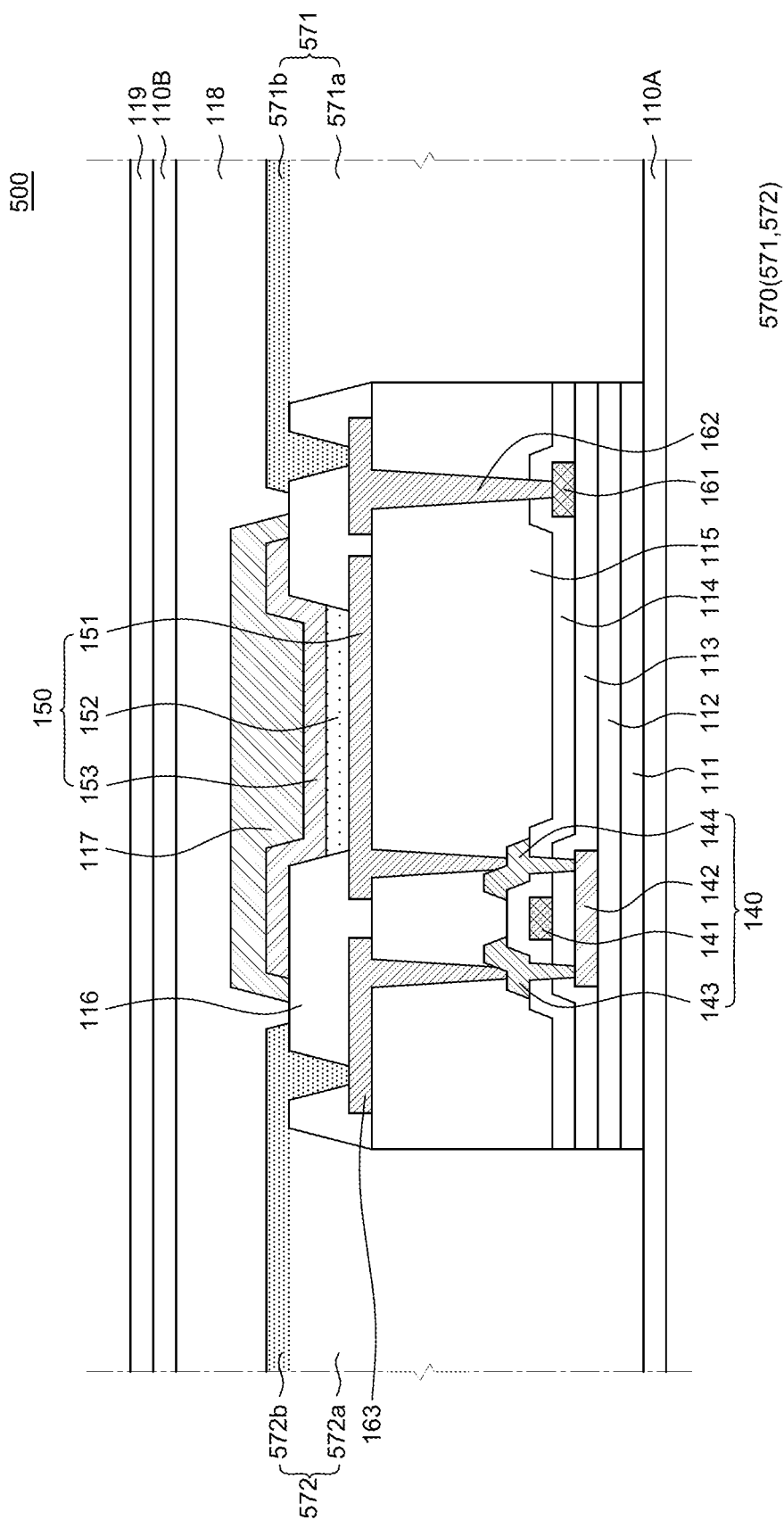
FIG. 5 is a schematic cross-sectional view of one subpixel of a stretchable display device according to another aspect of the present disclosure.

FIG. 5 is a schematic cross-sectional view of one subpixel of a stretchable display device according to another aspect of the present disclosure. A stretchable display device 500 shown in FIG. 5 is substantially the same as the stretchable display device 100 shown in FIGS. 1 to 4B except for having a different connecting line 570 (571 and 572), so repeated description is omitted.

Referring to FIG. 5, the top surface of base polymers 571a and 572a of the connecting line 570 is flat. In detail, the top surface of the base polymers 571a and 572a of the connecting line 570 such as a gate line and a data line may be higher than the top surface of the planarization layer 115 on a plurality of island substrates 111. Further, the top surface of the base polymers 571a and 572a may be higher (further away from lower substrate 110A) than the top surface of the bank 116 on the plurality of island substrates 111. Accordingly, the base polymer 571a of a first connecting line 571 functioning as a gate line may be the same in height at the top surface of the portion overlapping the plurality of island substrates 111 and the top surface of the areas disposed between the plurality of island substrates 111. Accordingly, the top surface of the first connecting line 571 may be flat.

Accordingly, the base polymer 572a of a second connecting line 572 functioning as a data line may be the same in height at the top surface of the portion overlapping the plurality of island substrates 111 and the top surface of the areas disposed between the plurality of island substrates 111. Accordingly, the top surface of the second connecting line 572 may be flat.

Accordingly, the top surface of the conductive particles 571b and 572b distributed at the upper portion of the base polymers 571a and 572a may be flat without a curve in a cross-sectional view.

A transistor 140, a planarization layer 115, an organic light emitting element 150, a bank 116, an encapsulation layer 117, etc. are disposed on the plurality of island substrates 111 spaced and disposed on the lower substrate 110A. Accordingly, a step may exist between the top surface of the bank 116 and the top surface of the lower substrate 110A.

At this time, if the top surface of the base polymers 571a and 572a is not flat and a step exists on the top surface of the base polymers 571a and 572a by the step between the top surface of the bank 116 and the top surface of the lower substrate 110A (as shown in FIG. 3), the base polymers 571a and 572a themselves may be cut or broken by the step on the top surface of the base polymers 571a and 572a. Further, when the stretchable display device 500 is bent or stretched, the base polymers 571a and 572a may be cut or broken by the step on the top surface of the base polymers 571a and 572a. In this case, the electrical path between the pads disposed on adjacent island substrates 111 is cut or broken, so an electrical signal may not be transmitted and a percentage defective of the stretchable display device 500 may increase.

Accordingly, the top surface of the base polymers 571a and 572a may be flat in the stretchable display device 500 according to another aspect of the present disclosure. Accordingly, in the base polymers 571a and 572a, the step between the top surface of the elements disposed on the plurality of island substrates 111 and the top surface of the lower substrate 110A on which the plurality of island substrates 111 is not disposed may be removed as shown in FIG. 5. Accordingly, a disconnection phenomenon of the connecting lines 570 including the base polymers 571a and 572a and the conductive particles 571b and 572b due to a step may be suppressed even though the stretchable display device 500 is bent or stretched.

Further, the top surface of the base polymers 571a and 572a is flat in a stretchable display device 500 according to another aspect of the present disclosure, so damage to the connecting lines 570 in the manufacturing process of the stretchable display device 500 may be minimized. In the manufacturing process of the stretchable display device 500, various components including the connecting lines 570 are formed in a state in which the plurality of island substrates 111 is disposed not on the lower substrate 110A, but on a glass substrate or sacrifice layer on a glass substrate. Thereafter, a sacrifice layer removal process such as laser release is performed, and the bottom surface of the plurality of island substrates 111 and the bottom surface of the base polymers 571a and 572a of the connecting lines 570 may be exposed. And, the lower substrate 110A may be bonded to the exposed bottom surface of the plurality of island substrates 111 and exposed bottom surface of the base polymers 571a and 572a.

In this case, in the process in which the sacrifice layer is removed, the base polymers 571a and 572a of the connecting lines 570 may be damaged such as tearing of the base polymers 571a and 572a. In particular, when the base polymers 571a and 572a are formed with a uniform thickness and a step exists on the top surface of the base polymers 571a and 572a, the base polymers 571a and 572a may be damaged or removed together in the sacrifice layer removal process. In this case, a problem may be generated with electrical signal transmission between the pads disposed on the plurality of island substrates 111 through the connecting line 570.

In the stretchable display device 500 according to another aspect of the present disclosure, the top surface of the base polymers 571a and 572a is formed flat, so the thickness of the base polymers 571a and 572a in the areas between the plurality of island substrates 111 may be increased. Accordingly, in the process in which the sacrifice layer is removed, damage to the base polymers 571a and 572a and the conductive paths formed by the conductive particles 571b and 572b distributed at the upper portion of the base polymers may be suppressed. Accordingly, stability of electrical signal transmission of the stretchable display device 500 may be increased.

<Base Polymer of Connecting Lines Covering Island Substrate>

Figure 6:
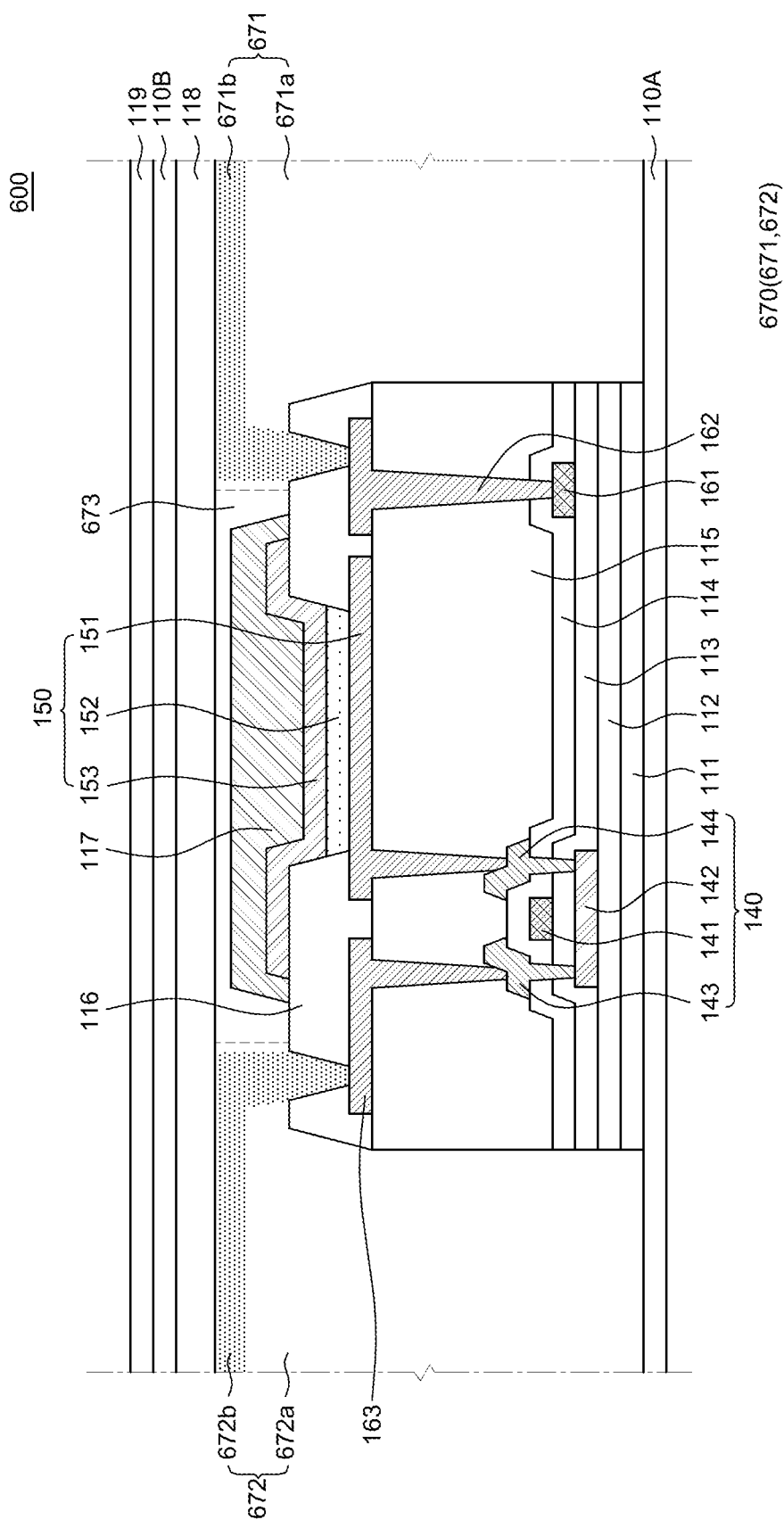
FIG. 6 is a schematic cross-sectional view of one subpixel of a stretchable display device according to another aspect of the present disclosure.

FIG. 6 is a schematic cross-sectional view of one subpixel of a stretchable display device according to another aspect of the present disclosure. The stretchable display device 600 of FIG. 6 is substantially the same as the stretchable display device 500 of FIG. 5 except that the connecting line 670 (671 and 672) further include an additional base polymer 673, so repeated description is omitted.

Referring to FIG. 6, the connecting lines 670 may include a first connecting line 671, a second connecting line 672, and an additional base polymer 673. The first connecting line 671 and the second connecting line 672 are substantially the same as the first connecting line 571 and the second connecting line 572 of FIG. 5, respectively, so repeated description is omitted.

The additional base polymer 673 of the connecting line 670 covers an encapsulation layer 117 disposed on a plurality of island substrates 111. In detail, the additional base polymer 673 may cover all of a planarization layer 115, a bank 116, an organic light emitting element 150, and an encapsulation layer 117 on the plurality of island substrates 111.

The base polymer 671a of the first connecting line 671, the base polymer 672a of the second connecting line 672, and the additional base polymer 673 may be made of one base polymer through the same process. That is, in the process of forming the base polymer 671a of the first connecting line 671 and the base polymer 672a of the second connecting line 672, the additional base polymer 673 may be simultaneously formed such that the base polymers 671a and 672a cover the components disposed on the plurality of island substrates 111. Accordingly, the top surface of the base polymers 671a, 672a and 673 that the connecting line 670 includes may be flat in the areas where the plurality of island substrates 111 is disposed and the entire areas between the plurality of island substrates 111. However, the conductive particles 671b and 672b may not be distributed in the additional base polymer 673.

In the stretchable display device 600 according to another aspect of the present disclosure, the base polymers 671a, 672a, 673 are disposed to cover all areas where the plurality of island substrates 111 is disposed and not disposed, and the top surface of the base polymers 671a, 672a, 673 may be formed flat. Accordingly, a step by various components disposed on the plurality of island substrates 111 may be removed. Accordingly, disconnection of the conductive path of the conductive particles 671b and 672b by a step may be suppressed.

Further, in the stretchable display device 600 according to another aspect of the present disclosure, the connecting line 670 includes the additional base polymer 673 extending on the encapsulation layer 117 on the plurality of island substrates 111. The additional base polymer 673 covers various components such as the planarization layer 115, the bank 116, the organic light emitting element 150, and the encapsulation layer 117 disposed on the plurality of island substrates 111, so the components of the stretchable display device 600 may be protected. The base polymers 671a and 672a and the additional base polymer 673 may completely seal various components disposed between the plurality of island substrates 111 and the additional base polymer 673. Accordingly, it is possible to protect various components from water, etc. that permeates from above the base polymers 671a and 672a and the additional base polymer 673. Further, even if the stretchable display device 600 is deformed such as bending or stretching, damage to the components between the additional base polymer 673 and the plurality of island substrates 111 may be suppressed.

<Various Shapes of Base Polymer of Connecting Lines>

Figure 7:
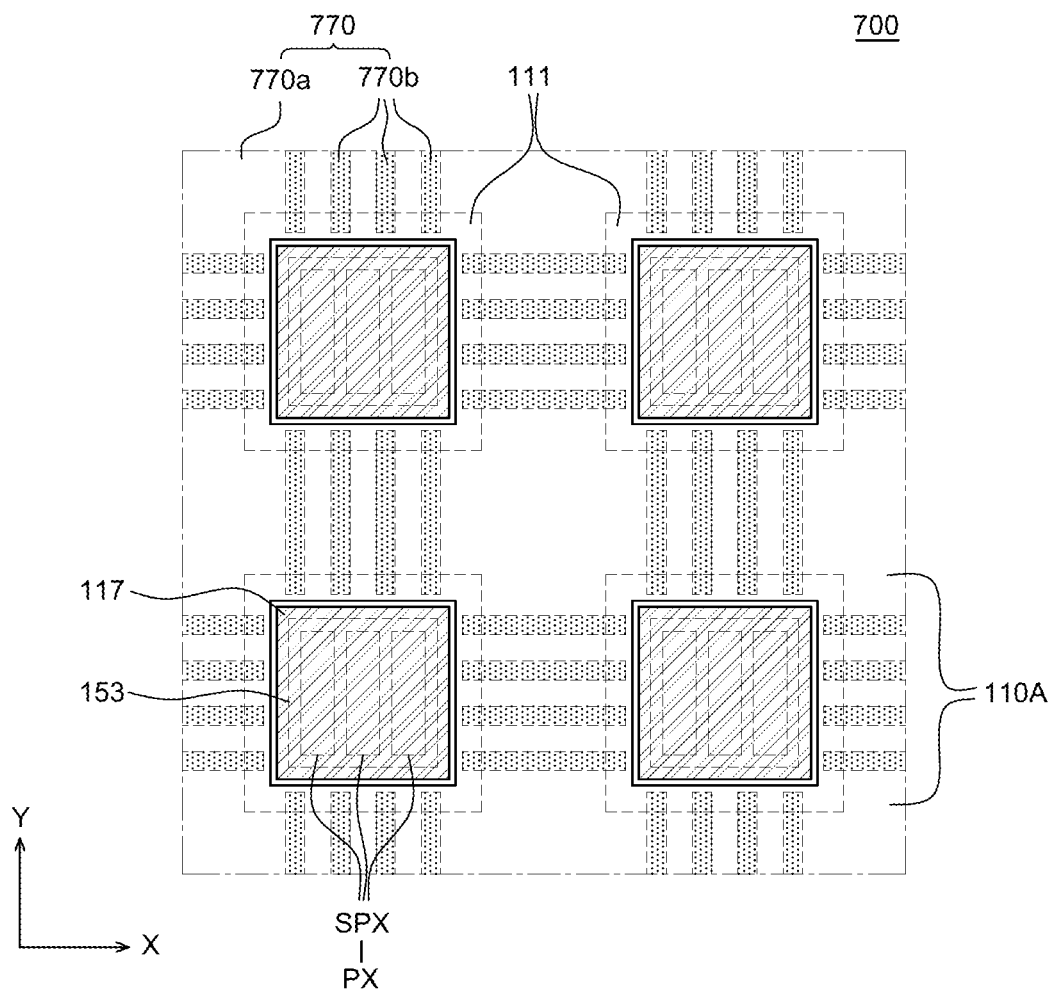
FIG. 7 is an enlarged plan view of a stretchable display device according to another aspect of the present disclosure.

FIG. 7 is an enlarged plan view of a stretchable display device according to another aspect of the present disclosure. A stretchable display device 700 shown in FIG. 7 is substantially the same as the stretchable display device 100 shown in FIGS. 1 to 4B except for having a different connecting line 770, so repeated description is omitted.

Referring to FIG. 7, the connecting line 770 of the stretchable display device 700 includes a base polymer 770a and conductive particles 770b. The base polymer 770a is disposed in the entire area except the areas where a plurality of island substrates 111 is disposed. The base polymer 770a is disposed as a single layer in contact with the lower substrate 110A, on the lower substrate 110A, that is, in the other areas excepting the areas overlapping the plurality of island substrates 111. Accordingly, the other areas except the areas overlapping the plurality of island substrates 111 of the lower substrate 110A may be covered by the base polymer 770a. Further, as described above, the base polymer 770a may be in contact with pads of the plurality of island substrates 111, so, a portion of the base polymer 770a may be disposed to cover the edge of the plurality of island substrates 111. The conductive particles 770b are the same as the conductive particles 171b and 172b described with reference to FIGS. 1 to 4B, repeated description is omitted.

In the stretchable display device 700 according to another aspect of the present disclosure, the base polymer 770a is disposed as a single layer in the entire area excepting the areas where the plurality of island substrates 111 is disposed on the lower substrate 110A, so the base polymer 770a may be more easily formed. That is, the base polymer 770a may be formed in a way in which it is applied to all areas excepting the areas where the plurality of island substrates 111 is disposed of the lower substrate 110A, so a separate process for patterning the base polymer 770a may not be needed. Accordingly, in the stretchable display device 700 according to another aspect of the present disclosure, the manufacturing process of the base polymer 770a and the connecting line 770 may be simplified, and the manufacturing costs and time may be reduced.

Further, in the stretchable display device 700 according to another aspect of the present disclosure, the base polymer 770a is disposed as a single layer in the entire area excepting the areas where the plurality of island substrates 111 is disposed on the lower substrate 110A, so it is possible to distribute force that is applied when the stretchable display device 700 is bent or stretched. For example, when the stretchable display device 700 is deformed such as bending or stretching, force such as tensile force may be applied to the stretchable display device 700, so the organic light emitting element 150 of the stretchable display device 700 may be damaged. In the stretchable display device 700 according to another aspect of the present disclosure, the base polymer 770a is disposed in the entire area excepting the areas where the plurality of island substrates 111 is disposed, so it is possible to distribute force by deformation of the stretchable display device 700. Accordingly, it is possible to protect several components of the stretchable display device 700.

Figure 8:
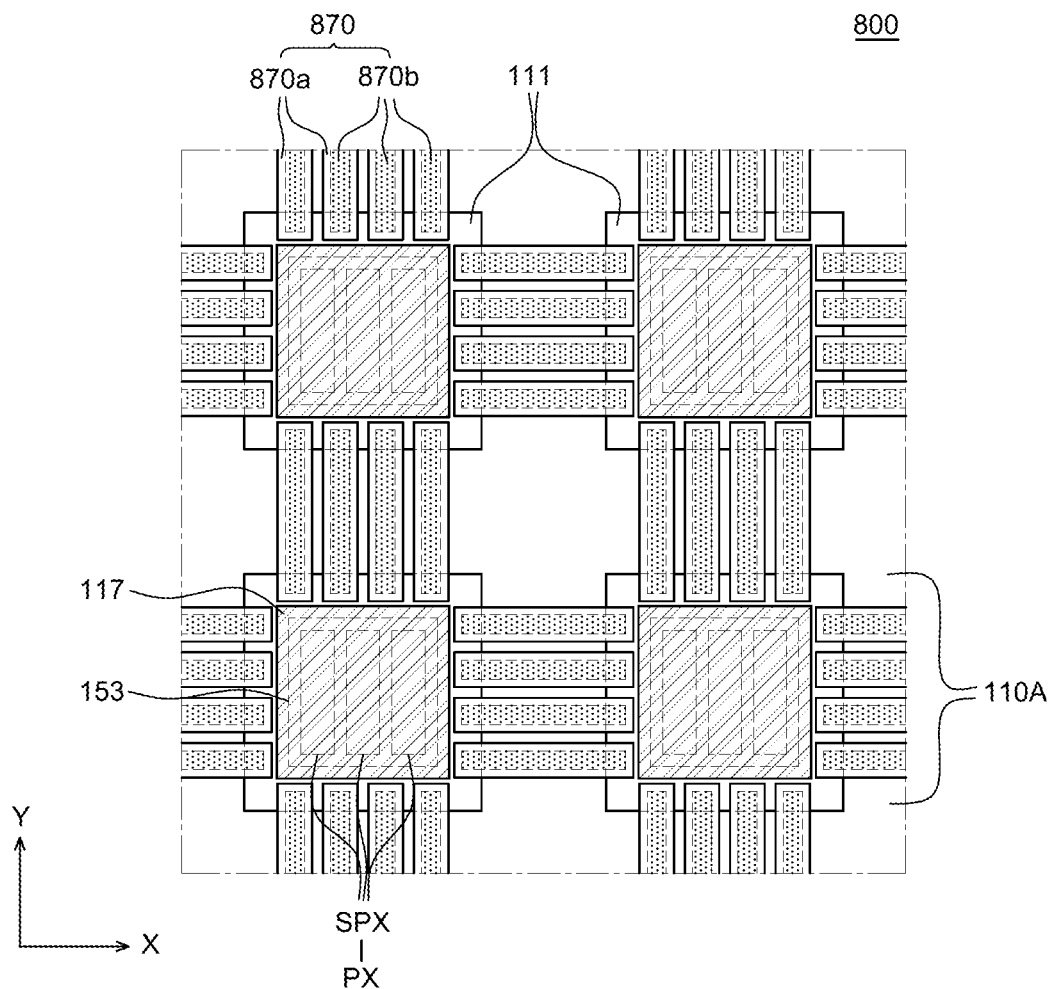
FIG. 8 is an enlarged plan view of a stretchable display device according to another aspect of the present disclosure.

FIG. 8 is an enlarged plan view of a stretchable display device according to another aspect of the present disclosure. A stretchable display device 800 shown in FIG. 8 is substantially the same as the stretchable display device 100 shown in FIGS. 1 to 4B except for having a different connecting line 870, so repeated description is omitted.

Referring to FIG. 8, the connecting line 870 of the stretchable display device 800 includes a base polymer 870a and conductive particles 870b. The base polymer 870a may be disposed only in areas overlapping the conductive particles 870b on the lower substrate 110A. That is, the base polymer 870a may include a plurality of sub-base polymers overlapping the conductive particles 870b. The plurality of sub-base polymers may be spaced apart from each other and disposed only in areas overlapping conductive paths formed by the conductive particles. However, when the plurality of sub-base polymers and the areas where the conductive particles 870b are distributed are the same in width, aligning may be difficult in the process of injecting the conductive particles 870b. Accordingly, in consideration of a process error, as shown in FIG. 8, the width of the plurality of sub-base polymers of the base polymer 870a may be larger than the width of the areas where the conductive particles 870b are distributed.

When conductive particles are injected to form a plurality of conductive paths on a single base polymer, conductive particles supposed to form different conductive paths may be unintentionally connected to each other, so adjacent conductive paths may be connected to each other. In this case, two lines transmitting different signals are connected, so a problem may be generated with signal transmission.

Accordingly, in the stretchable display device 800 according to another aspect of the present disclosure, the base polymer 870a includes a plurality of sub-base polymers and the plurality of sub-base polymers may be disposed only in the areas overlapping the conductive particles 870b or may be disposed in areas the same as or larger than the areas where the conductive particles 870b are distributed. Accordingly, a plurality of conductive paths formed by the conductive particles 870b may be separated from each other by the plurality of sub-base polymers. Accordingly, each of the conductive paths formed by the conductive particles 870b may not be connected to each other, and a problem may not be generated with signal transmission of the stretchable display device 800.

<Connecting Lines Configured by Metal Material>

Figure 9:
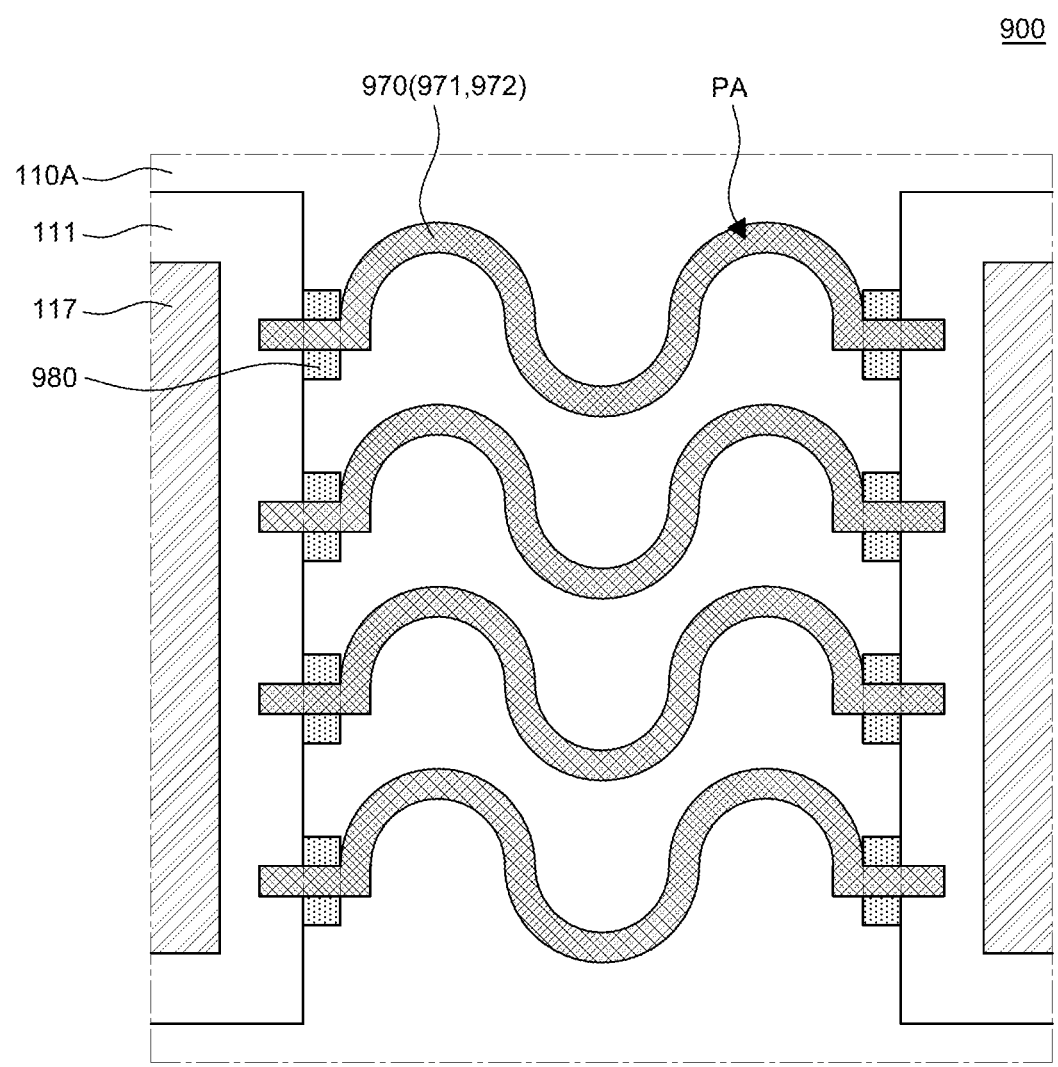
FIG. 9 is an enlarged plan view of a stretchable display device according to another aspect of the present disclosure.
Figure 10:
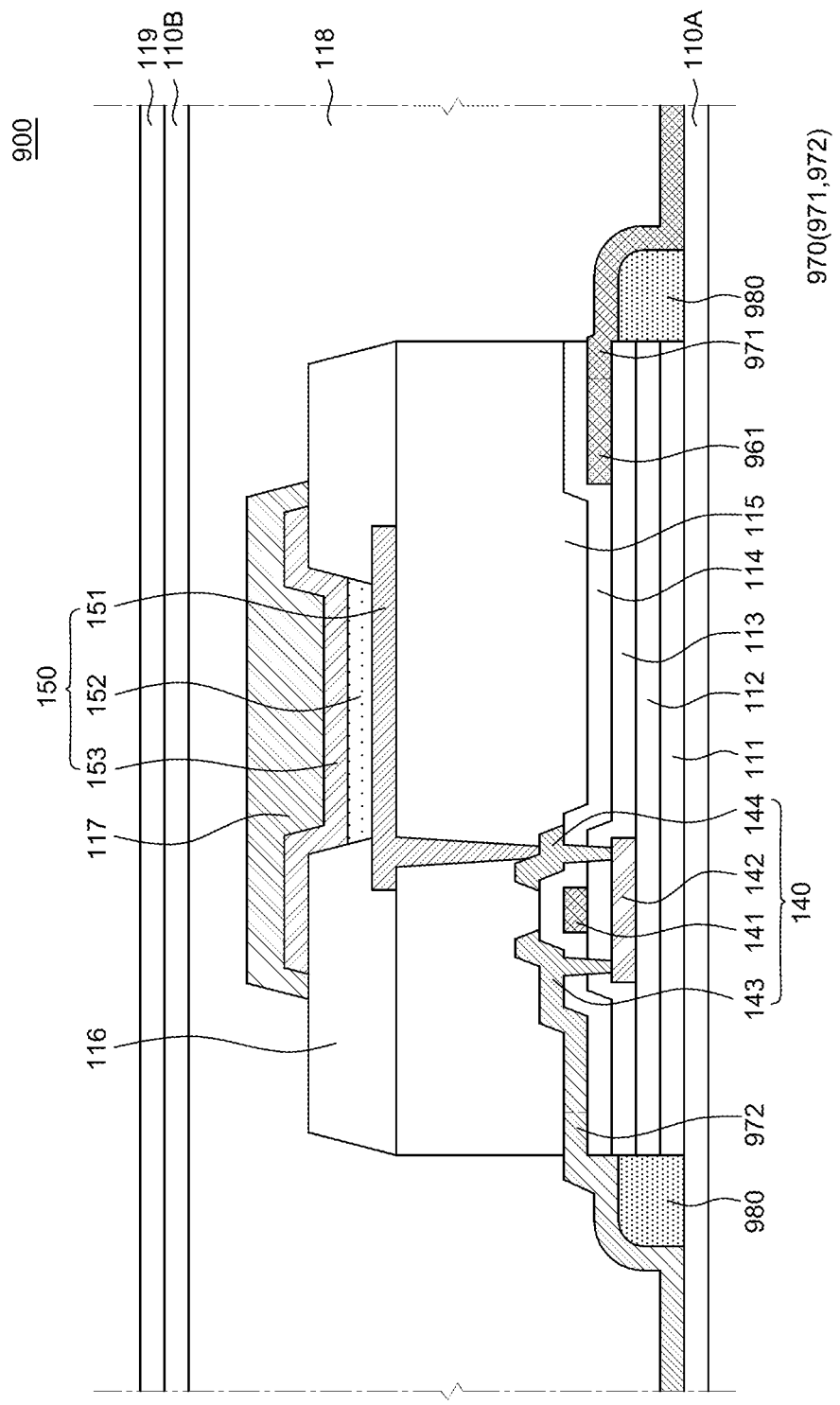
FIG. 10 is a cross-sectional view schematically showing one subpixel of the stretchable display device of FIG. 9.

FIG. 9 is an enlarged plan view of a stretchable display device according to another aspect of the present disclosure. FIG. 10 is a cross-sectional view schematically showing one subpixel of the stretchable display device of FIG. 9. A stretchable display device 900 shown in FIGS. 9 and 10 is substantially the same as the stretchable display device 100 shown in FIGS. 1 to 4B except for having a different connecting line 970 and further including a conductive reinforcing member 980, so repeated description is omitted.

Only encapsulation layers 117 of various components disposed on island substrates 111, and connecting lines 970 are shown in FIG. 9 for the convenience of description.

Referring to FIG. 9, the connecting lines 970 of a stretchable display device 900 have a curved shape. The connecting lines 970 electrically connect the pads disposed on adjacent island substrates 111 of a plurality of island substrates 111 and each extend not in a straight line, but in a curved shape between the pads. For example, as shown in FIGS. 9 and 10, a first connecting line 971 of the connecting lines 970 may have a sine waveform. However, the shape of the first connecting line 971 is not limited to this shape and may have various shapes. For example, the first connecting line 971 may have various shapes, for example, they may extend in a zigzag shape or a plurality of diamond-shaped connecting lines with the apexes not at the peak area, PA, connected (see FIG. 13 and corresponding description for further explanation of peak area, PA). Moreover, the shape of the first connecting line may be any shape that allows deformation towards a straight line when stretched, twisted or otherwise distorted. Further, the second connecting line 972 may have the same shape as the first connecting line 971.

Referring to FIG. 10, a gate pad 961 is formed on a gate insulating layer 113 and a first connecting line 971 is formed on the gate insulating layer 113 and the lower substrate 110A.

Referring to FIG. 10, the first connecting line 971 that can function as a gate line is connected with the gate pad 961 and extends from the top surface of the gate insulating layer 113 to the top surface of the lower substrate 110A. Accordingly, the first connecting lines 971 may electrically connect the gate pads 961 respectively formed on adjacent island substrates 111. The first connecting line 971 is in contact with the lower substrate 110A between the plurality of island substrates 111 except for the area overlapping the conductive reinforcing member 980.

The first connecting line 971 and the gate pad 961 may be made of the same material as a gate electrode 141. Accordingly, the first connecting line 971 and the gate pad 961 may be simultaneously formed in the same process as the gate electrode 141. Accordingly, the first connecting line 971 may be integrally formed by extending from the gate pad 961. However, the present disclosure is not limited thereto, and the gate pad 961 and the first connecting line 971 may be made of different materials, and may be disposed on different layers and electrically connected.

Referring to FIG. 10, a second connecting line 972 that can function as a data line is formed on an inter-layer insulating layer 114. The source electrode 143 may extend outside an island substrate 111, may function as a data pad, and may be electrically connected with the second connecting line 972. However, the present disclosure is not limited thereto, and a separate data pad may be defined as extending from the source electrode 143 or being electrically connected with the source electrode 143.

Further, the second connecting line 972 is connected with the source electrode 143 and extends from the top surface of an adjacent island substrate 111 to the top surface of the lower substrate 110A. Accordingly, the second connecting line 972 may electrically connect the data pad formed on each of adjacent island substrates 111. The second connecting line 972 is in contact with the lower substrate 110A between the plurality of island substrates 111 except for the area overlapping the conductive reinforcing member 980.

The second connecting line 972 may be made of the same material as a data pad, that is, the source electrode 143. Accordingly, the second connecting line 972, the source electrode 143, and the drain electrode 144 may be simultaneously formed in the same process. Accordingly, the second connecting line 972 may be integrally formed by extending from the source electrode 143. However, the present disclosure is not limited thereto, and the second connecting line 972 and the source electrode 143 may be made of different materials, and may be disposed on different layers and electrically connected.

In the stretchable display device 900 according to another aspect of the present disclosure, connecting lines 970 electrically connecting pads formed on the plurality of island substrates 111, such as the first connecting line 971 and the second connecting line 972, may be made of the same material as at least one of a plurality of conductive components 141, 143, 144, 151, 153 disposed on the plurality of island substrates 111. For example, the first connecting line 971 may be made of the same material as the gate electrode 141 and the second connecting line 972 may be made of the same material as the source electrode 143. However, the present disclosure is not limited thereto and the connecting lines 970 may be made of the same material as (other than the gate electrode 141 and the source electrode 143), a drain electrode 144, the electrodes of an organic light emitting element 150 such as an anode 151 and a cathode 153 of the organic light emitting element 150, or various lines included in the stretchable display device 900. Accordingly, the connecting lines 970 may be simultaneously formed in the manufacturing process of conductive components 141, 143, 144, 151, 153 disposed on the plurality of island substrates 111 and made of the same material as the connecting lines 970 in the stretchable display device 900 according to another aspect of the present disclosure. Therefore, there may not be a need for a separate manufacturing process for forming the connecting lines 970.

<Conductive Reinforcing Member>

A conductive reinforcing member 980 is disposed under a portion of the connecting line 970. The conductive reinforcing member 980 is a component that suppresses damage or disconnection of the connecting lines 970 when the stretchable display device 900 is repeatedly stretched, and that helps electrical signal transmission by being in contact with the connecting lines 970 even if the connecting lines 970 are cut or broken.

The conductive reinforcing member 980 may be a conductive polymer including a base polymer and conductive particles distributed in the base polymer. The conductive reinforcing member 980, which is a conductive polymer with conductive particles uniformly distributed in a base polymer, may have a flexible property because the base polymer has stretching property. That is, the conductive reinforcing member 980 may be a conductive flexible layer having both conductivity and flexibility.

The base polymer is a base layer in which conductive particles can be distributed, and may include styrene butadiene styrene (SBS), but is not limited thereto. Accordingly, the base polymer has stretching property, so when the stretchable display device 900 is bent or stretched, the base polymer may not be damaged.

The conductive particles, which are particles having conductivity, may include at least one of silver (Ag), gold (Au), and carbon.

The conductive particles may be uniformly distributed in the base polymer. That is, the density of the conductive particles in the conductive reinforcing member 980 may be uniform. For example, the conductive reinforcing member may be formed in a way of putting a base polymer in a separate container, uniformly distributing conductive particles in the base polymer by putting in and stirring the conductive particles, and then coating the base polymer in which the conductive particles are distributed on the lower substrate 110A, but is not limited thereto.

The conductive reinforcing member 980 may be disposed adjacent to sides of the plurality of island substrates 111 under the connecting lines 970 such as the first connecting line 971 and the second connecting line 972. For example, referring to FIG. 10, the conductive reinforcing member 980 may be in contact with the bottom surface of the first connecting line 971 and the sides of the plurality of island substrates 111. Further, the conductive reinforcing member 980 may be in contact with a side of the buffer layer 112 and a side of the gate insulating layer 113, depending on the height of the conductive reinforcing member 980. That is, the conductive reinforcing member 980 is disposed under the first connecting line 971 in an area adjacent to the plurality of island substrates 111 of the first connecting line 971 and may be in contact with a side of at least some of the components disposed under the gate pad 961.

<Effect of Connecting Line and Conductive Reinforcing Member>

When a connecting line is made of the same material as the conductive components 141, 143, 144, 151, 153 disposed on a plurality of island substrates, that is, a connecting line is made of a metal material, a flexible property of the connecting line may be low. In this case, when a stretchable display device is deformed such as bending or stretching, the connecting line may be damaged, for example, a crack is generated in the connecting line having a low flexible property. Accordingly, a problem may be generated with transmission of an electrical signal between pads on the plurality of island substrates.

Accordingly, in the stretchable display device 900 according to another aspect of the present disclosure, the connecting line 970 has a curved shape, so damage to the connecting line 970 may be minimized even though the stretchable display device 900 is deformed such as bending or stretching. Accordingly, in the stretchable display device 900 according to another aspect of the present disclosure, even though the connecting line 970 is made of a metal material, electrical signals may be stably transmitted between the pads on the plurality of island substrates 111.

Further, when a plurality of island substrates is disposed on a lower substrate and connecting lines are formed on the lower substrate to electrically connect pads of adjacent island substrates, a step may exist on the connecting lines disposed on the plurality of island substrates and the connecting lines disposed on the lower substrate by the thickness of several components disposed on the plurality of island substrates. In particular, the thickness of the plurality of island substrates may be larger than the entire thickness of several components disposed on the plurality of island substrates. For example, the thickness of the plurality of island substrates may be about 6 μm. Accordingly, when a stretchable display device is bent or stretched by a step caused by the components on the plurality of island substrates, there is a problem that the connecting lines may be damaged such as disconnection of the connecting lines at the portion where a step of the connecting lines exists, particularly, the boundary portion of the island substrates.

Accordingly, in the stretchable display device 900 according to another aspect of the present disclosure, damage to the connecting lines 970 may be suppressed by disposing the conductive reinforcing member 980 being in contact with sides of the plurality of island substrates 111 and including a base polymer having flexible property, under the connecting lines 970. In detail, the conductive reinforcing member 980 includes a base polymer having a flexible property. And, the conductive reinforcing member 980 is disposed under the connecting lines 970 in areas adjacent to the plurality of island substrates 111, so a step on the top surface of the connecting lines 970 may be attenuated (the corner of the step may be made smoother, in other words rounded), and accordingly, a rapid height change of the connecting lines 970 may be reduced. Accordingly, even if the stretchable display device 900 is bent or stretched, damage that may be generated in the connecting lines 970 may be minimized by step attenuation of the conductive reinforcing member 980. Further, even if the connecting lines 970 are damaged at the boundary portion of the island substrates 111, the conductive reinforcing member 980 provides a conductive path, so signal transmission through the connecting lines 970 may be stably provided.

Further, in the stretchable display device 900 according to another aspect of the present disclosure, the conductive reinforcing member 980 disposed under the connecting lines 970 may reinforce the adhesive force between the connecting lines 970 and the lower substrates 110A. When the connecting line 970 made of a metal material is directly disposed on the lower substrate 110A, a phenomenon in which the connecting lines 970 come off the lower substrate 110A may be generated due to a weak adhesive force between the lower substrate 110A and the connecting lines 970. Accordingly, in the stretchable display device 900 according to another aspect of the present disclosure, the conductive reinforcing member 980 is disposed between the connecting lines 970 and the lower substrate 110A, so the adhesive force between the connecting lines 970 and the lower substrate 110A may be reinforced, and the connecting lines 970 coming off the lower substrate 110A may be suppressed.

<Conductive Reinforcing Member Made of Liquid Metal>

Meanwhile, the conductive reinforcing member 980 may include liquid metal. The liquid metal means metal existing in a liquid state at room temperature. For example, the liquid metal may include at least one of gallium, indium, natrium, lithium, and an alloy thereof, but is not limited thereto. When a crack is generated in the connecting lines 970, the liquid metal may fill the crack of the connecting lines 970. Accordingly, in the stretchable display device 900 according to another aspect of the present disclosure, the conductive reinforcing member 980 includes liquid metal, so disconnection of the connecting lines 970 may be minimized by filling the crack with the liquid metal even though the stretchable display device 900 is deformed such as bending or stretching and a crack is generated in the connecting lines. Further, the liquid metal has conductivity, so the entire resistance in the connecting lines 970 and the liquid metal may be reduced. Accordingly, there is an effect that electrical signals may be more smoothly transmitted between the pads on the plurality of island substrates 111. Any conductive reinforcing member of any embodiment described herein may be made of liquid metal.

<Conductive Reinforcing Member Over Connecting Line>

Figure 11:
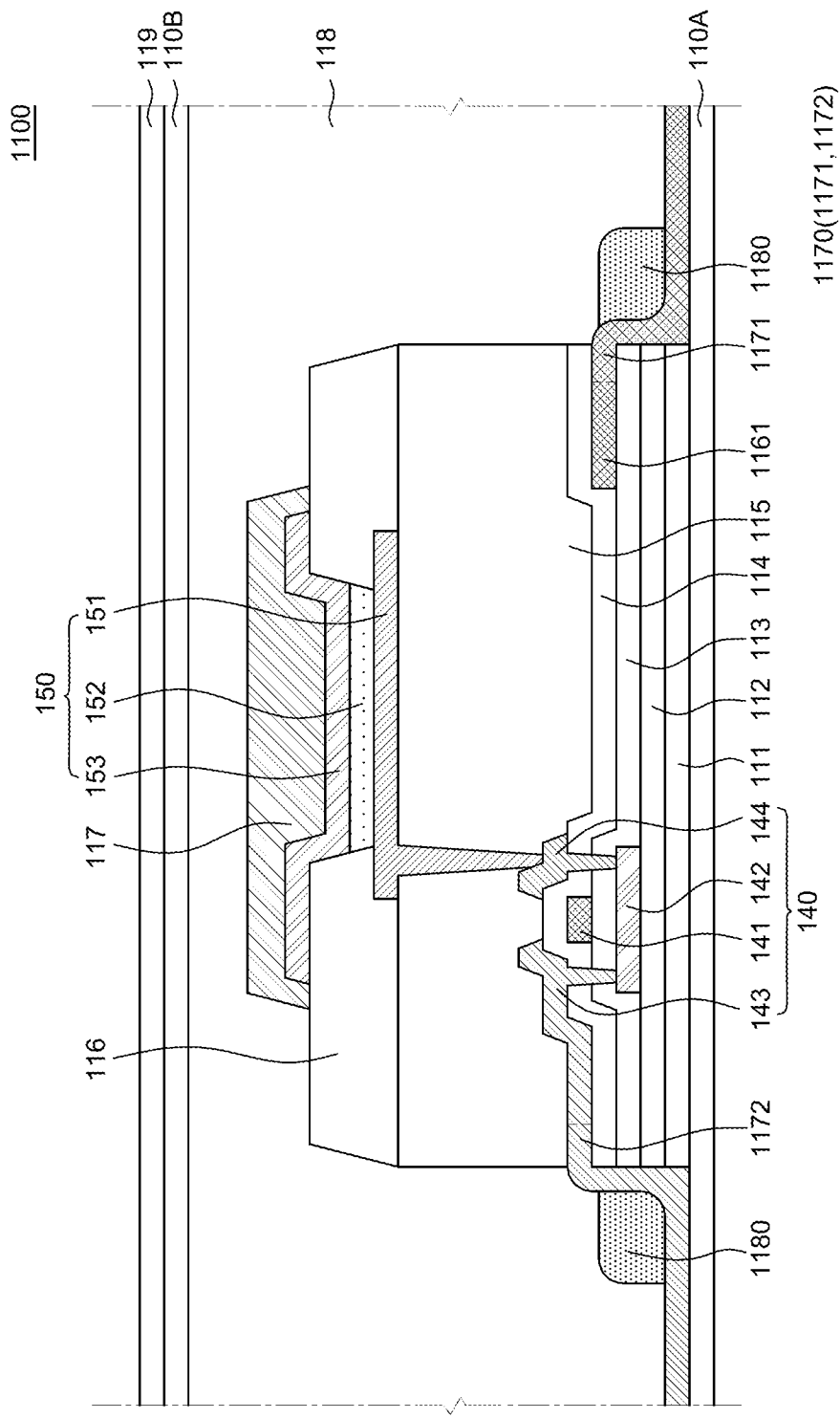
FIG. 11 is a schematic cross-sectional view of one subpixel of a stretchable display device according to another aspect of the present disclosure.

FIG. 11 is a schematic cross-sectional view of one sub-pixel of a stretchable display device according to another aspect of the present disclosure. A stretchable display device 1100 shown in FIG. 11 is substantially the same as the stretchable display device 900 shown in FIGS. 9 and 10 except that the positions where conductive reinforcing member 1180 and a connecting line 1170 are disposed are different, so repeated description is omitted.

Referring to FIG. 11, the conductive reinforcing member 1180 is disposed over a portion of the connecting line 1170. The conductive reinforcing member 1180, which is a conductive polymer with conductive particles distributed in a base polymer, as described above, may be a conductive flexible layer having both conductivity and flexibility.

The conductive reinforcing member 1180 may be disposed over the connecting lines 1170, adjacent to sides of a plurality of island substrates 111. In detail, the conductive reinforcing member 1180 may be disposed adjacent to sides of the island substrates 111 with a first connecting line 1171 therebetween in contact with the top surface of the first connecting line 1171, which can function as a gate line, and not in contact with the sides of the island substrates 111. As described above, in the first connecting line 1171, a step may exist between areas overlapping the plurality of island substrates 111 and areas not overlapping the plurality of island substrates 111. For example, an island substrate 111, a buffer layer 112, and a gate insulating layer 113 are disposed under the first connecting line 1171 in the areas overlapping the plurality of island substrates 111. Accordingly, a step corresponding to the entire thickness of the island substrate 111, the buffer layer 112, and the gate insulating layer 113 may be generated in the first connecting line 1171. The conductive reinforcing member 1180 may be disposed on the first connecting line 1171 in the area adjacent to the plurality of island substrates 111, that is, the area where a step of the first connecting line 1171 is generated.

And, the conductive reinforcing member 1180 may be disposed in areas adjacent to sides of the island substrates 111 with a second connecting line 1172 therebetween in contact with the second connecting line 1172, which can function as a data line, and not in contact with the sides of the island substrates 111. As described above, in the second connecting line 1172, a step may exist between areas overlapping the plurality of island substrates 111 and areas not overlapping the plurality of island substrates 111. For example, an island substrate 111, a buffer layer 112, a gate insulating layer 113, and an inter-layer insulating layer 114 are disposed under the second connecting line 1172 in the areas overlapping the plurality of island substrates 111. Accordingly, a step corresponding to the entire thickness of the island substrate 111, the buffer layer 112, the gate insulating layer 113, and the inter-layer insulating layer 114 may be generated in the second connecting line 1172. The conductive reinforcing member 1180 may be disposed on the second connecting line 1172 in the area adjacent to the plurality of island substrates 111, that is, the area where a step of the second connecting line 1172 is generated.

Accordingly, in the stretchable display device 1100 according to another aspect of the present disclosure, damage to the connecting lines 1170 may be suppressed by including the conductive reinforcing member 1180 disposed adjacent to sides of the plurality of island substrates 111 over the connecting lines 1170. In detail, the conductive reinforcing member 1180 includes a base polymer having a flexible property. And, a step may be generated on the top surface of the connecting lines 1170 by the entire thickness of a plurality of layers disposed under the connecting lines 1170 in the areas overlapping the plurality of island substrates 111. When the stretchable display device 1100 is deformed such as bending or stretching, damage such as generation of crack or disconnection of the connecting lines 1170 may be generated. The conductive reinforcing member 1180 is disposed over the connecting lines 1170 in the areas adjacent to the plurality of island substrates 111, so even if the connecting lines 1170 is cracked or disconnected, an electrical signal may be transmitted through the conductive reinforcing member 1180 being in contact with the top surface of the connecting lines 1170. Accordingly, the electrical signal transmission of the stretchable display device 1100 may be stably made.

Further, in the stretchable display device 1100 according to another aspect of the present disclosure, the conductive reinforcing member 1180 is disposed over the connecting lines 1170, so the process of forming the conductive reinforcing member 1180 may be more easily performed. In detail, the conductive reinforcing member 1180 may be formed on the connecting lines 1170 before the upper substrate 110B and the polarizing plate 119 are bonded by the adhesive layer 118 after the connecting lines 1170 and various components on the plurality of island substrates 111 are all formed. Accordingly, in the stretchable display device 1100 according to another aspect of the present disclosure, there is no need for forming the conductive reinforcing member 1180 during the manufacturing process of the transistor 140 or the organic light emitting element 150. Therefore, the manufacturing process of the conductive reinforcing member 1180 may be more easily made, and the manufacturing time or manufacturing costs may be minimized.

<Conductive Reinforcing Member Between Plurality of Connecting Lines>

Figure 12:
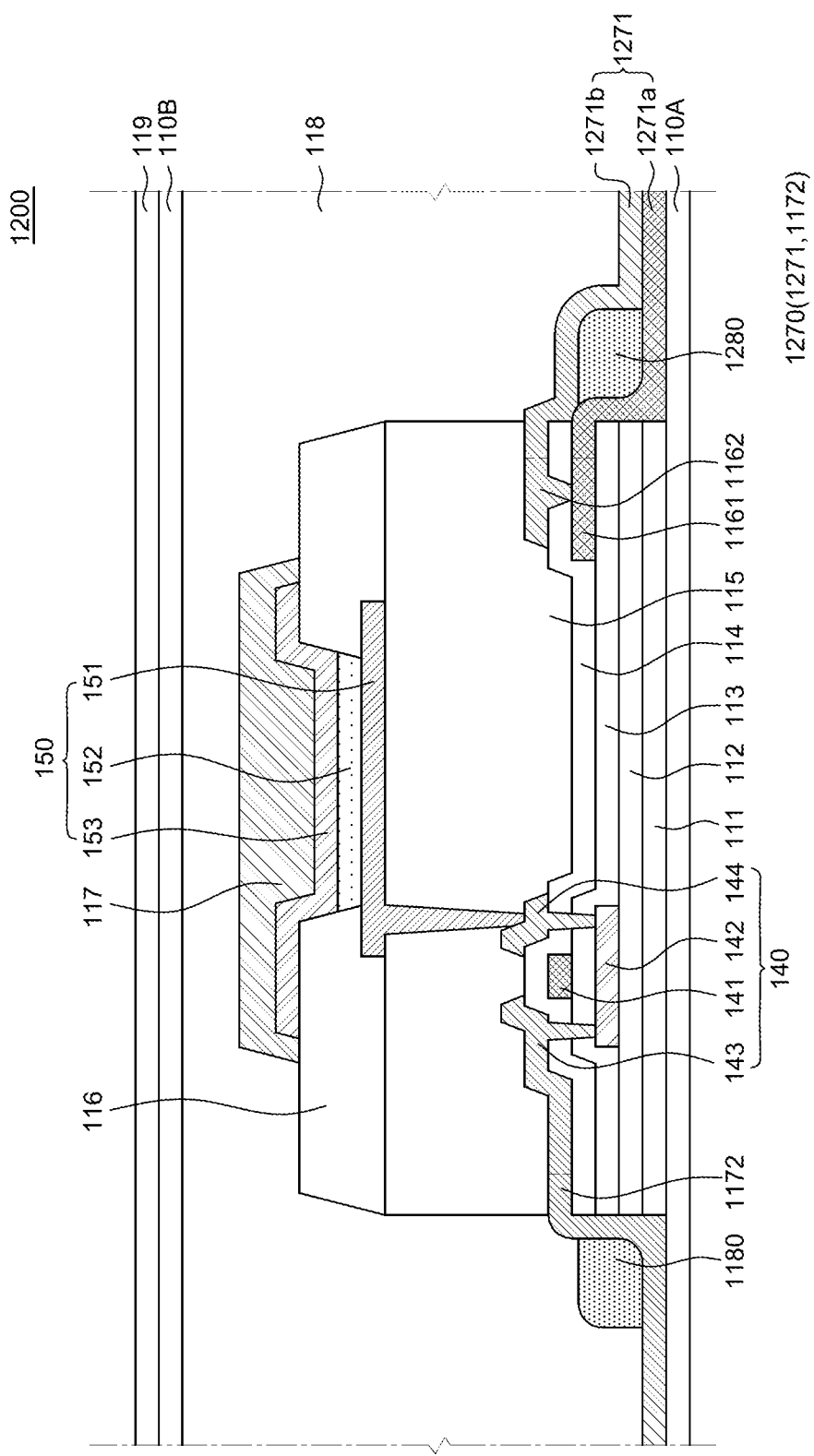
FIG. 12 is a schematic cross-sectional view of one subpixel of a stretchable display device according to another aspect of the present disclosure.

FIG. 12 is a schematic cross-sectional view of one sub-pixel of a stretchable display device according to another aspect of the present disclosure. A stretchable display device 1200 shown in FIG. 12 is substantially the same as the stretchable display device 1100 shown in FIG. 11 except for having different connecting lines 1270 and conductive reinforcing member 1280, so repeated description is omitted.

Referring to FIG. 12, a first connecting line 1271 of the stretchable display device 1200 includes a first sub-connecting line 1271a and a second sub-connecting line 1271b. In detail, a first gate pad 1161 and the first sub-connecting line 1271a are disposed on a gate insulating layer 113. The first gate pad 1161 and the first sub-connecting line 1271a may be made of the same material as a gate electrode 141. Accordingly, the gate electrode 141, the first gate pad 1161, and the first sub-connecting line 1271a may be simultaneously formed.

The first sub-connecting line 1271a is connected with the first gate pad 1161 and extends onto the lower substrate 110A from the top surface of the gate insulating layer 113. Accordingly, the first sub-connecting lines 1271a may electrically connect the first gate pads 1161 formed on adjacent island substrates 111. The first sub-connecting line 1271a may be in contact with the lower substrate 110A between the plurality of island substrates 111.

The conductive reinforcing member 1280 is disposed on the first sub-connecting line 1271a in areas adjacent to sides of the plurality of island substrates 111 between the plurality of island substrates 111. An island substrate 111, a buffer layer 112, and a gate insulating layer 113 are disposed under the first sub-connecting line 1271a in the areas overlapping the plurality of island substrates 111. Accordingly, a step corresponding to the entire thickness of the island substrate 111, the buffer layer 112, and the gate insulating layer 113 may be generated in the first sub-connecting line 1271a. The conductive reinforcing member 1280 may be disposed on the first sub-connecting line 1271a in the area adjacent to the plurality of island substrates 111, that is, the area where a step of the first sub-connecting line 1271a is generated.

An inter-layer insulating layer 114 is disposed on the first gate pad 1161 and the first sub-connecting line 1271a. Further, a second gate pad 1162 and the second sub-connecting line 1271b are disposed on the inter-layer insulating layer 114. The second gate pad 1162 is electrically connected with the first gate pad 1161 through a contact hole formed in the inter-layer insulating layer 114. The second gate pad 1162 and the second sub-connecting line 1271b may be made of the same material, and for example, may be made of the same material as the source electrode 143 and the drain electrode 144. Accordingly, the second gate pad 1162 and the second sub-connecting line 1271b may be formed simultaneously with the source electrode 143 and the drain electrode 144.

The second sub-connecting line 1271b is connected with the second gate pad 1162 and extends onto the conductive reinforcing member 1280 from the top surface of the inter-layer insulating layer 114. And the second sub-connecting line 1271b extends onto the first sub-connecting line 1271a from the top surface of the conductive reinforcing member 1280. Accordingly, conductive reinforcing member 1280 is disposed over the first sub-connecting line 1271a and under the second sub-connecting line 1271b, and is disposed between the first sub-connecting line 1271a and the second sub-connecting line 1271b. Accordingly, the top surface of the first sub-connecting line 1271a and the bottom surface of the conductive reinforcing member 1280 are in contact, and the bottom surface of the second sub-connecting line 1271b and the top surface of the conductive reinforcing member 1280 are in contact.

In the stretchable display device 1200 according to another aspect of the present disclosure, the first connecting line 1271 includes the first sub-connecting line 1271a and the second sub-connecting line 1271b, and the conductive reinforcing member 1280 is disposed between the first sub-connecting line 1271a and the second sub-connecting line 1271b. As described above, a step may be generated between the portion of the first connecting line 1271 overlapping the plurality of island substrates 111 and the other portion not overlapping the plurality of island substrates 111. Accordingly, when the stretchable display device 1200 is deformed such as bending or stretching, damage such as cracking or disconnection may be generated in the first connecting line 1271. In this case, in the stretchable display device 1200 according to another aspect of the present disclosure, the conductive reinforcing member 1280 is disposed on the first sub-connecting line 1271a, so even if the first sub-connecting line 1271a is cracked or disconnected, electrical signals may be transmitted by the conductive reinforcing member 1280. Further, a step of the second sub-connecting line 1271b may be compensated or reduced by the conductive reinforcing member 1280, so damage such as cracking or disconnection of the second sub-connecting line 1271b may be suppressed.

Further, in the stretchable display device 1200 according to another aspect of the present disclosure, the conductive reinforcing member 1280 is disposed between the first sub-connecting line 1271a and the second sub-connecting line 1271b. Further, the first sub-connecting line 1271a, the second sub-connecting line 1271b, and the conductive reinforcing member 1280 are electrically connected. Accordingly, the entire resistance of the first sub-connecting line 1271a, the second sub-connecting line 1271b, and the conductive reinforcing member 1280 may be reduced, so the electrical signal transmission of the stretchable display device 1200 may be more stably made.

In some aspects, the second connecting line 1172, as the first connecting line 1271, also may include a first sub-connecting line and a second sub-connecting line. In this case, one of the first sub-connecting line and the second sub-connecting line may be a line connected with the source electrode 143 and the other one may be made of the same material as the conductive component disposed under the source electrode 143, for example, the same material as the gate electrode 142, or may be made of the same material as the conductive component disposed over the source electrode 143, for example, the same material as the anode 151. And, the conductive reinforcing member 1180 may be disposed between the first sub-connecting line and the second sub-connecting line of the second connecting line 1172.

<Conductive Reinforcing Member Disposed in Peak Area of Connecting Line>

Figure 13:
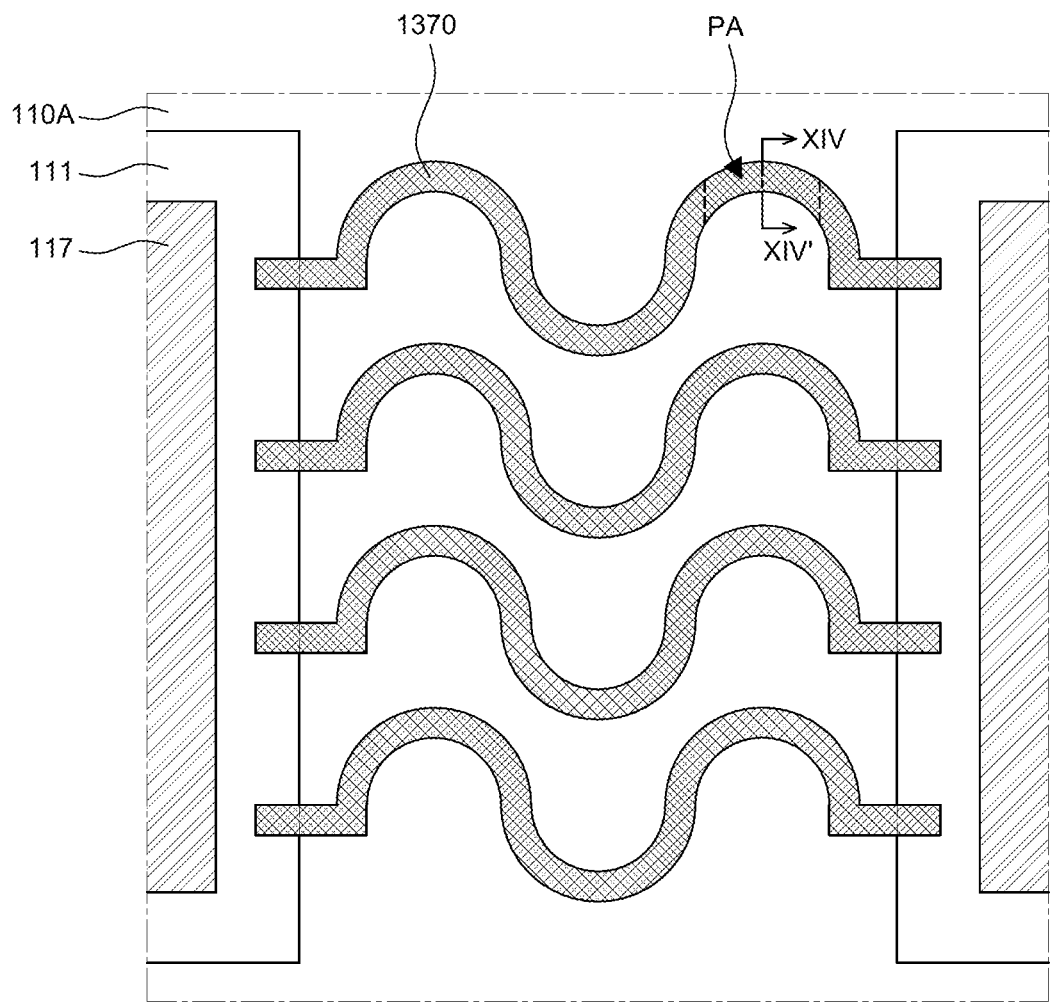
FIG. 13 is an enlarged plan view of a stretchable display device according to another aspect of the present disclosure.
Figure 14A:
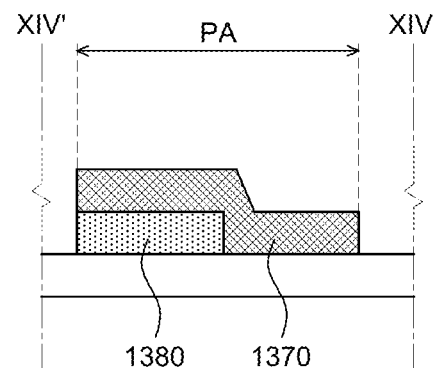
FIG. 14A and FIG. 14B are cross-sectional views taken along line XIV-XIV' of FIG. 13.
Figure 14B:
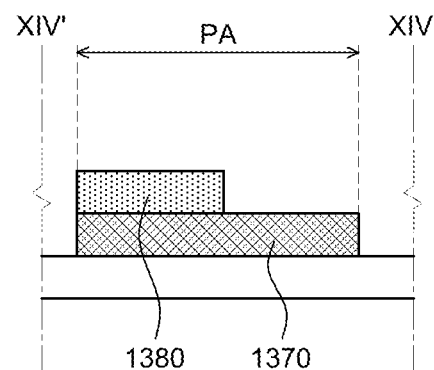

FIG. 13 is an enlarged plan view of a stretchable display device according to another aspect of the present disclosure. FIG. 14A and FIG. 14B are cross-sectional views taken along line XIV-XIV' of FIG. 13. A stretchable display device 1300 shown in FIGS. 13 to 14B is substantially the same as the stretchable display device 900 shown in FIGS. 9 and 10 except for having different connecting lines 1370 and a conductive reinforcing member 1380, so repeated description is omitted. Only encapsulation layers 117 of various components disposed on island substrates 111, and connecting lines 1370 are shown in FIG. 13 for the convenience of description.

Referring to FIGS. 13 to 14B, a conductive reinforcing member 1380 is disposed in a peak area PA of a connecting line 1370. The peak area PA of the connecting line 1370 means an area where the amplitude of the curved connecting line 1370 is largest. For example, as shown in FIG. 13, when the connecting lines 1370 have a sine waveform, the point where the amplitude of the connecting lines 1370 is largest may be defined as a peak area PA. A corresponding PA is also shown in FIG. 9. When the connecting lines 1370 have another shape such as a zigzag or diamond shape, the corresponding point where the zigzag or diamond changes direction may be defined as a peak area PA as would be understood. When the stretchable display device 1300 is deformed such as bending or stretching, stress may concentrate on the peak area PA of the connecting lines 1370, as compared with other areas of the connecting lines 1370.

At this time, the conductive reinforcing member 1380 may be disposed at the inner edge or inside of the peak area PA of the connecting lines 1370. The inner edge of the peak area PA of the connecting lines 1370 may mean an area where a radius of curvature is relatively small in the peak area PA of the connecting lines 1370 and the outer edge of the peak area PA may mean an area where the radius of curvature is relatively large in the peak area PA of the connecting lines 1370.

In general, when a line has a curved shape, an area with a small radius of curvature may receive larger stress than an area with a large radius of curvature. Accordingly, when the stretchable display device 1300 is deformed such as bending or stretching, the inner edge of the peak area PA of the connecting lines 1370 may be an area where stress is concentrated more than the outer edge.

Accordingly, in the stretchable display device 1300 according to another aspect of the present disclosure, as shown in FIG. 14A, the conductive reinforcing member 1380 may be disposed under the connecting line 1370 at the inner edge of the peak area PA of the connecting line 1370. The conductive reinforcing member 1380 may be disposed in an area overlapping the inner edge of the peak area PA of the connecting line 1370, and may be in contact with the bottom surface of the connecting line 1370 under the connecting line 1370.

Further, in the stretchable display device 1300 according to another aspect of the present disclosure, as shown in FIG. 14B, the conductive reinforcing member 1380 may be disposed over the connecting line 1370 at the inner edge of the peak area PA of the connecting line 1370. The conductive reinforcing member 1380 may be disposed in an area overlapping the inner edge of the peak area PA of the connecting line 1370, and may be in contact with the top surface of the connecting line 1370 over the connecting line 1370.

In the stretchable display device 1300 according to another aspect of the present disclosure, the conductive reinforcing member 1380 may be disposed in the peak area PA of the connecting line 1370, and particularly, may be disposed at the inner edge of the peak area PA. In detail, the peak area PA of the connecting line 1370 is an area with large amplitude in comparison to the other area of the connecting line 1370, so the peak area PA of the connecting line 1370 may be an area where stress applied to the connecting line 1370 is concentrated. Further, the radius of curvature of the inner edge of the peak area PA of the connecting line 1370 may be smaller than the radius of curvature of the outer edge. Accordingly, stress applied to the connecting line 1370 may be more concentrated at the inner edge of the peak area PA. Accordingly, when the stretchable display device 1300 is deformed such as bending or stretching, damage such as a crack or disconnection may be easily generated in the peak area PA of the connecting lines 1370, particularly, at the inner edge of the peak area PA in comparison to other areas. At this time, the conductive reinforcing member 1380 may be disposed in an area overlapping the peak area PA of the connecting line 1370, particularly, may be disposed over or under the connecting line 1370 in contact with the connecting line 1370 in an area overlapping the inner edge. Accordingly, a crack or damage that is generated in the connecting line 1370 may be reduced by the conductive reinforcing member 1380. Further, even if damage is generated in the peak area PA of the connecting lines 1370 or at the inner edge of the peak area PA, the conductive reinforcing member 1380 may suppress blocking of an electrical signal, so transmission of electrical signals in the stretchable display device 1300 may be more stably performed. Any shape of connecting line in any embodiment having a peak area PA may have a conductive reinforcing member disposed either under, over, at an inner edge or at an outer edge, or any combination thereof, in a peak area of the connecting line as described.

<Stretchable Display Device Including Micro LED>

Figure 15:
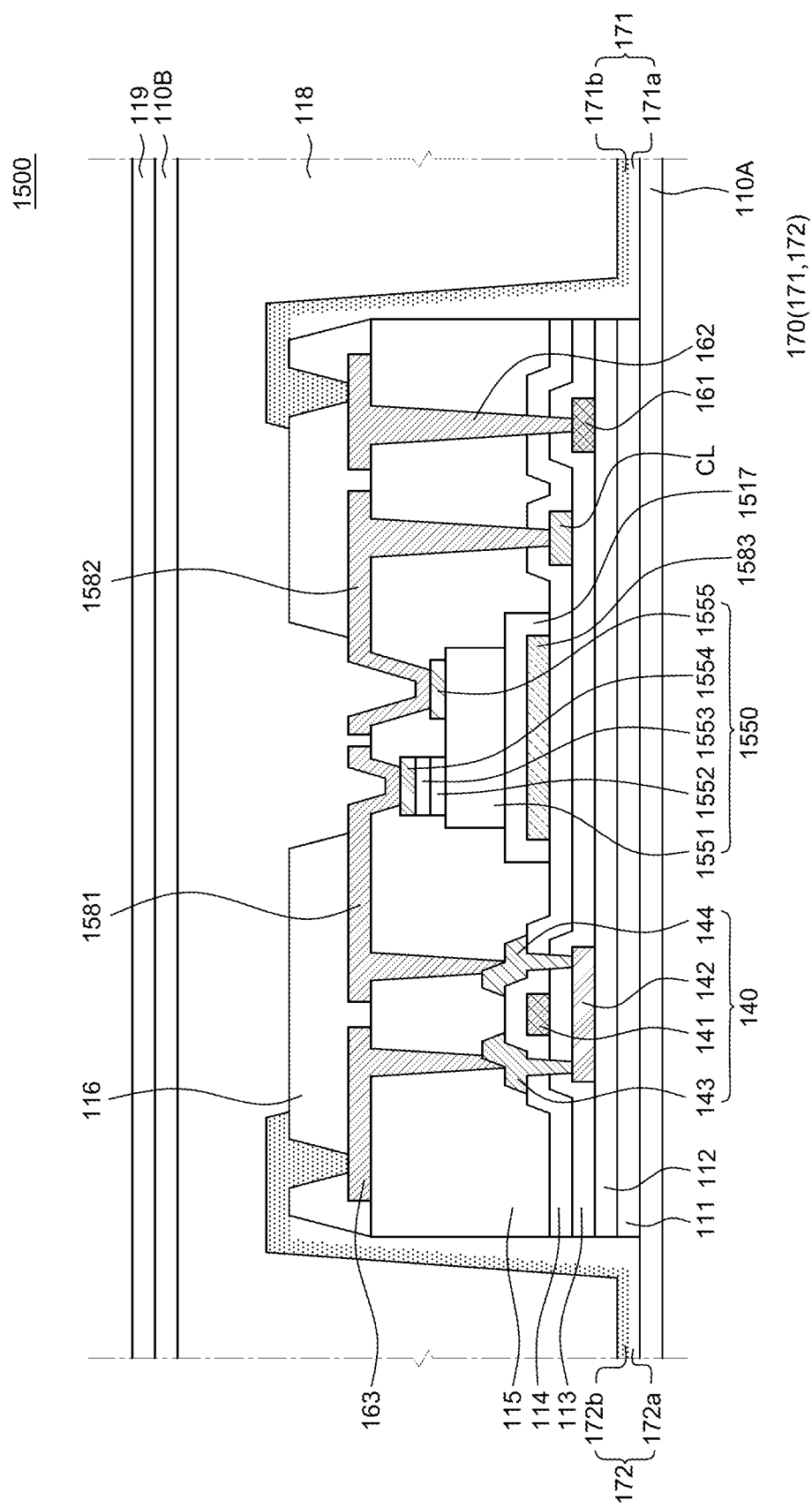
FIG. 15 is a schematic cross-sectional view showing one subpixel of a stretchable display device according to another aspect of the present disclosure.

FIG. 15 is a schematic cross-sectional view showing one subpixel of a stretchable display device according to another aspect of the present disclosure. A stretchable display device 1500 shown in FIG. 15 is substantially the same as the stretchable display device 100 shown in FIGS. 1 to 4B except for including a different LED 1550, so repeated description is omitted.

Referring to FIG. 15, a common line CL is disposed on the gate insulating layer 113. The common line CL is a line applying a common voltage to a plurality of subpixels SPX. The common line CL may be made of the same material as the source electrode 143 and the drain electrode 144 of the transistor 140, but is not limited thereto.

A reflective layer 1583 is disposed on the inter-layer insulating layer 114. The reflective layer 1583 is a layer for discharging light emitted in the direction of the lower substrate 110A from the LED 1550 to the outside the stretchable display device 1500 by reflecting the light upward towards a user of the stretchable display device 1500. The reflective layer 1583 may be made of a metal material having high reflectance.

An adhesive layer 1517 is disposed on the reflective layer 1583 to cover the reflective layer 1583. The adhesive layer 1517, which is a layer for bonding the LED 1550 on the reflective layer 1583, may insulate the reflective layer 1583 made of a metal material and the LED 1550. The adhesive layer 1517 may be made of a thermosetting material or a photocuring material, but is not limited thereto. Although the adhesive layer 1517 covers only the reflective layer 1583 in FIG. 15, the position of the adhesive layer 1517 is not limited thereto.

The LED 1550 is disposed on the adhesive layer 1517. The LED 1550 overlaps the reflective layer 1583. The LED 1550 includes an n-type layer 1551, an active layer 1552, a p-type layer 1553, an n-electrode 1555, and a p-electrode 1554. The LED 1550 is described as a lateral LED 1550 hereafter, but the structure of the LED 1550 is not limited thereto, and may be, for example, a vertical type LED or a flip-chip LED.

In detail, the n-type layer 1551 of the LED 1550 overlaps the reflective layer 1583 on the adhesive layer 1517. The n-type layer 1551 may be formed by injecting an n-type impurity into gallium nitride. The active layer 1552 is disposed on the n-type layer 1551. The active layer 1552, which is a light emitting layer that emits light in the LED 1550, may be made of a nitride semiconductor, for example, indium gallium nitride. The p-type layer 1553 is disposed on the active layer 1552. The p-type layer 1553 may be formed by injecting a p-type impurity into gallium nitride. However, the materials composing the n-type layer 1551, the active layer 1552, and the p-type layer 1553 are not limited thereto.

The p-electrode 1554 is disposed on the p-type layer 1553 of the LED 1550. The n-electrode 1555 is disposed on the n-type layer 1551 of the LED 1550. The n-electrode 1555 is spaced and disposed apart from the p-electrode 1554. In detail, the LED 1550 may be manufactured by sequentially stacking the n-type layer 1551, the active layer 1552, and the p-type layer 1553, etching a predetermined portion of the active layer 1552 and the p-type layer 1553, and then forming the n-electrode 1555 and the p-electrode 1554. The predetermined portion is a space for spacing the n-electrode 1555 and the p-electrode 1554 and the predetermined portion may be etched to expose a portion of the n-type layer 1551. In other words, the surface of the LED 1550 where the n-electrode 1555 and the p-electrode 1554 are disposed is not a planarized surface and may have different height levels. Accordingly, the p-electrode 1554 is disposed on the p-type layer 1553, the n-electrode 1555 is disposed on the n-type layer 1551, and the p-electrode 1554 and the n-electrode 1555 are spaced and disposed apart from each other at different height levels. Therefore, the n-electrode 1555 may be disposed closer to the reflective layer 1583 than the p-electrode 1554. The n-electrode 1555 and p-electrode 1554 may be made of a conductive material, for example, a transparent conductive oxide. Alternatively, the n-electrode 1555 and p-electrode 1554 may be made of the same material, but are not limited thereto.

A planarization layer 115 is disposed on the inter-layer insulating layer 114 and the adhesive layer 1517. The planarization layer 115 is a layer that planarizes the top surface of the transistor 140. The planarization layer 115 may be disposed in an area excepting the area where the LED 1550 is disposed while planarizing the top surface of the planarization layer 115. The planarization layer 115 may be composed of two or more layers.

A first electrode 1581 and a second electrode 1582 are disposed on the planarization layer 115. The first electrode 1581 is an electrode that electrically connects the transistor 140 and the LED 1550. The first electrode 1581 is connected with the p-electrode 1554 of the LED 1550 through a contact hole formed at the planarization layer 115. The first electrode 1581 is connected with the drain electrode 144 of the transistor 140 through contact holes formed at the planarization layer 115. However, the first electrode 1581 is not limited thereto and may be connected with the source electrode 143 of the transistor 140, depending on the type of the transistor 140. The p-electrode 1554 of the LED 1550 and the drain electrode 144 of the transistor 140 may be electrically connected by the first electrode 1581.

The second electrode 1582 is an electrode that electrically connects the LED 1550 and the common line CL. In detail, the second electrode 1582 is connected with the common line CL through contact holes formed at the planarization layer 115 and the inter-layer insulating layer 114 and is connected with the n-electrode 1555 of the LED 1550 through a contact hole formed at the planarization layer 115. Accordingly, the common line CL and the n-electrode 1555 of the LED 1550 are electrically connected.

When the stretchable display device 1500 is turned on, voltages having different levels may be supplied respectively to the drain electrode 144 of the transistor 140 and the common line CL. The voltage that is applied to the drain electrode 144 of the transistor 140 may be applied to the first electrode 1581 and a common voltage may be applied to the second electrode 1582. Voltages having different levels may be applied to the p-electrode 1554 and the n-electrode 1555 through the first electrode 1581 and the second electrode 1582, so the LED 1550 may emit light.

Although the transistor 140 is electrically connected with the p-electrode 1554 and the common line CL is electrically connected with the n-electrode 1555 in the description referring to FIG. 15, they are not limited thereto. That is, the transistor 140 may be electrically connected with the n-electrode 1555 and the common line CL may be electrically connected with the p-electrode 1554.

A bank 116 is disposed on the planarization layer 115, the first electrode 1581, the second electrode 1582, the data pad 163, and the connecting pad 162. The bank 116 is disposed to overlap an end of the reflective layer 1583 and a portion of the reflective layer 1583 not overlapping the bank 116 may be defined as a light emitting area. The bank 116 may be made of an organic insulating material and may be made of the same material as the planarization layer 115. The bank 116 may be configured to include a black material to suppress mixing of colors due to light emitted from the LED 1550 and transmitted to an adjacent subpixel SPX.

The stretchable display device 1500 according to another aspect of the present disclosure includes the LED 1550. Since the LED 1550 is made of not an organic material, but an inorganic material, reliability is high, so the lifespan is longer than that of a liquid crystal display element or an organic light emitting element. The LED 1550 is quickly turned on, consumes a small amount of power, has high stability because it has high shock-resistance, and may display high-luminance images because it has high emission efficiency. Accordingly, the LED 1550 is an element that is suitable to be applied even to very large screens. In particular, since the LED 1550 is made of not an organic material, but an inorganic material, an encapsulation layer that is required when an organic light emitting element is used may not be used. Accordingly, the encapsulation layer that may be easily damaged, such as cracking, when the stretchable display device 1500 is stretched may be omitted. Accordingly, it is possible not to use an encapsulation layer that may be damaged when the stretchable display device 1500 according to another aspect of the present disclosure is deformed such as bending or stretching, by using the LED 1550 as a display element in the stretchable display device 1500. Further, since the LED 1550 is made of not an organic material, but an inorganic material, the display elements of the stretchable display device 1500 according to another aspect of the present disclosure may be protected from water or oxygen and their reliability may be high.

The exemplary aspects of the present disclosure can also be described as follows:

According to an aspect of the present disclosure, a stretchable display device comprises a plurality of island substrates on which a plurality of pixels is defined and that is spaced apart from each other; a lower substrate disposed under the plurality of island substrates; connecting lines that electrically connect pads disposed on adjacent island substrates of the plurality of island substrates, and have a curved shape; and conductive reinforcing members disposed to be in contact with some areas of the connecting lines.

The stretchable display device may further comprise a plurality of conductive components respectively disposed on the plurality of island substrates, wherein the connecting lines may be made of the same material as at least one of the plurality of conductive components.

The conductive reinforcing members may include a base polymer and a conductive polymer including conductive particles distributed in the base polymer, or liquid metal.

The conductive reinforcing members may be disposed to be adjacent to sides of the plurality of island substrates.

The conductive reinforcing members may be disposed in peak areas of the connecting lines.

The conductive reinforcing members may be disposed at inner edges of the peak areas of the connecting lines.

The conductive reinforcing members may be disposed to be in contact with the top surface or the bottom surface of the connecting lines.

The connecting lines may include a first sub-connecting line and a second sub-connecting line disposed on the first sub-connecting line, and the conductive reinforcing members may be disposed between the first sub-connecting line and the second sub-connecting line.

The connecting lines may be in contact with the lower substrate.

The stretchable display device may further comprise an adhesive layer disposed to cover the connecting lines; and an upper substrate disposed on the adhesive layer and disposed to overlap the lower substrate.

The curved shape may include a zigzag shape, a sine waveform, or a diamond shape.

The stretchable display device may further comprise a plurality of display elements disposed on the plurality of island substrates, wherein the plurality of display elements may be inorganic light emitting elements or organic light emitting elements.

According to another aspect of the present disclosure, a stretchable display device comprises a lower flexible substrate; a plurality of rigid substrates that is disposed on the lower flexible substrate, on which a plurality of pixels is defined, and that is spaced apart from each other; connecting lines that electrically connect pads disposed between adjacent rigid substrates of the plurality of rigid substrates, and are made of the same material as conductive components disposed on the plurality of rigid substrates; and conductive flexible layers disposed on the top surface or the bottom surface of the connecting lines.

The conductive components may be made of the same material as at least one of a gate electrode, a source electrode, and a drain electrode of a thin film transistor, a line, and an electrode of a display element.

The conductive flexible layers may include a base polymer and conductive particles distributed in the base polymer, or liquid metal.

The conductive flexible layers may be disposed to be in contact with sides of the plurality of rigid substrates or such that the connecting lines exist between the conductive flexible layers and the plurality of rigid substrates.

The conductive flexible layers may be disposed to overlap an area with the largest amplitude of the connecting lines.

The conductive flexible layers may be disposed inside the area with the largest amplitude.

The connecting lines may include a first sub-connecting line and a second sub-connecting line disposed on the first sub-connecting line, and the conductive flexible layers may be disposed between the first sub-connecting line and the second sub-connecting line.

According to an aspect of the present disclosure, a display structure comprises a first flexible substrate having a first modulus of elasticity; a plurality of second substrates positioned on the first flexible substrate and spaced apart from each other, each of the second substrates being rigid and having a second modulus of elasticity that is greater than first modulus of elasticity; at least one semiconductor transistor positioned on each of the second substrates of the plurality; and electrically conductive lines extending between respective ones of the second substrates, each of the electrically conductive lines configured to be stretched while remaining electrically conductive.

Each of the second substrates of the plurality may have a light emitting element positioned thereon.

At least one of the electrically conductive lines extending between respective ones of the second substrates may be a data line that provides a data signal to the light emitting element on the second substrate.

The second modulus of elasticity may be more than one thousand times greater than the first modulus of elasticity.

The electrically conductive lines may have a flexible, twisty, wavy shape.

The electrically conductive lines may have a stretchable diamond shape.

At least one of the electrically conductive lines extending between respective ones of the second substrates may be a gate line for the at least one transistor.

According to an aspect of the present disclosure, a method of using a stretchable display comprises stretching a first substrate having a first modulus of elasticity a first distance; maintaining as rigid and unstretched a plurality of second substrates that are positioned on the first substrate positioned a first distance away from each other, each of the second substrates having a second modulus of elasticity that is greater that the first modulus of elasticity, each of the second substrates of the plurality having at least one semiconductor transistor thereon; moving the respective second substrates a second distant from each other that is greater than the first distance during the stretching; and maintaining an electrical connection by a stretchable conductive line between respective ones of the plurality of second substrates prior to and after the stretching.

The plurality of second substrates each may include an organic light emitting diode and further including the step of: transmitting a light emission data signal to the organic light emitting diodes during the stretching.

The method may further include terminating the stretching; and returning the first substrate to the unstretched shape after the stretching.

According to another aspect of the present disclosure, a method of making a stretchable display panel comprises providing a first flexible substrate having a first modulus of elasticity; forming respective semiconductor transistor circuits on a plurality of second, rigid substrates, each of the second, rigid substrates having a second modulus of elasticity that is greater than the modulus of elasticity of the first flexible substrate, placing each of the plurality of second, rigid substrates on the first substrate spaced a selected distance apart from each other; and forming electrically conductive lines connecting the plurality of second, rigid substrates to each other with respective electrically conductive lines, each of the electrically conductive lines being flexible and has third modulus of elasticity that is less than the second modulus of elasticity.

The method may further include forming an organic light emitting diode on at least some of the respective ones of the plurality of second, rigid substrates prior to placing each of the plurality of second, rigid substrates on the first substrate.

Although the exemplary aspects of the present disclosure have been described in detail with reference to the accompanying drawings, the present disclosure is not limited thereto and may be embodied in many different forms without departing from the technical concept of the present disclosure. Any embodiment of this disclosure may be combined with one or more of any of the other embodiments. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A stretchable display device, comprising:
a lower substrate;
a plurality of island substrates where a plurality of pixels is defined, spaced apart from each other and disposed on the lower substrate and;
a plurality of connecting lines electrically connected to a plurality of pads disposed on adjacent island substrates among the plurality of island substrates and disposed on the lower substrate, wherein the plurality of connecting lines has a curved shape; and
a plurality of conductive reinforcing members in contact with a portion of each connecting line and in direct contact with a lateral side of the plurality of island substrates,
wherein the plurality of conductive reinforcing members is disposed between an upper surface of the lower substrate and a lower surface of the plurality of connecting lines.

2. The stretchable display device of claim 1, further comprising a plurality of conductive components disposed on each island substrate, wherein the plurality of connecting lines is made of a same material as at least one of the plurality of conductive components.

3. The stretchable display device of claim 1, wherein the plurality of conductive reinforcing members include a base polymer and a liquid metal or a conductive polymer that has conductive particles distributed in the base polymer.

4. The stretchable display device of claim 1, wherein the plurality of conductive reinforcing members is disposed only in a region adjacent to the lateral side of the plurality of island substrates.

5. The stretchable display device of claim 1, wherein the plurality of conductive reinforcing members is disposed only in a peak area of the plurality of connecting lines.

6. The stretchable display device of claim 1, wherein the plurality of conductive reinforcing members is in contact with a top surface or a bottom surface of the plurality of connecting lines.

7. The stretchable display device of claim 1, wherein the plurality of connecting lines includes a first sub-connecting line and a second sub-connecting line disposed on the first sub-connecting line, and the plurality of conductive reinforcing members is disposed between the first sub-connecting line and the second sub-connecting line.

8. The stretchable display device of claim 1, wherein the plurality of connecting lines is in contact with the lower substrate.

9. The stretchable display device of claim 1, further comprising:
an adhesive layer covering the plurality of connecting lines; and
an upper substrate disposed on the adhesive layer and overlapping the lower substrate.

10. The stretchable display device of claim 1, wherein the curved shape includes a zigzag shape, a sine waveform, or a diamond shape.

11. The stretchable display device of claim 1, further comprising a plurality of display elements disposed on the plurality of island substrates, wherein the plurality of display elements is inorganic light emitting elements or organic light emitting elements.

12. The stretchable display device of claim 5, wherein the plurality of conductive reinforcing members is disposed at an inner edge of the peak area of the plurality of connecting lines.

13. A stretchable display device comprising:
a lower flexible substrate;
a plurality of rigid substrates where a plurality of pixels is defined, spaced apart from each other and disposed on the lower flexible substrate;
a plurality of connecting lines electrically connected to a plurality of pads disposed between adjacent rigid substrates among the plurality of rigid substrates, disposed on the lower substrate, and are made of a same material as a plurality of conductive components disposed on the plurality of rigid substrates; and
a plurality of conductive flexible layers disposed on one of a top surface and a bottom surface of the plurality of connecting lines,
wherein the plurality of conductive flexible layers is disposed only in a region adjacent to a lateral side of the plurality of rigid substrates or overlap only an area with the largest amplitude of the connecting lines.

14. The stretchable display device of claim 13, wherein the plurality of conductive components is made of s same material as at least one of a gate electrode, a source electrode, and a drain electrode of a thin film transistor, a line, and an electrode of a display element.

15. The stretchable display device of claim 13, wherein the plurality of conductive flexible layers includes a base polymer and conductive particles distributed in the base polymer, or liquid metal.

16. The stretchable display device of claim 13, wherein the plurality of conductive flexible layers is disposed to be in contact with sides of the plurality of rigid substrates or such that the connecting lines exist between the conductive flexible layers and the plurality of rigid substrates.

17. The stretchable display device of claim 13, further comprising:
- an adhesive layer covering the plurality of connecting lines; and
- an upper substrate disposed on the adhesive layer and overlapping the lower substrate.

18. The stretchable display device of claim 16, wherein the plurality of conductive flexible layers is disposed inside the area with the largest amplitude.

19. The stretchable display device of claim 18, wherein the plurality of connecting lines includes a first sub-connecting line and a second sub-connecting line disposed on the first sub-connecting line, and the plurality of conductive flexible layers is disposed between the first sub-connecting line and the second sub-connecting line.

* * * * *